United States Patent
Lee

(10) Patent No.: US 7,649,584 B2
(45) Date of Patent: Jan. 19, 2010

(54) LCD ARRAY SUBSTRATE AND FABRICATION METHOD THEREOF

(75) Inventor: Su Woong Lee, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 37 days.

(21) Appl. No.: 11/725,478

(22) Filed: Mar. 20, 2007

(65) Prior Publication Data

US 2007/0188670 A1    Aug. 16, 2007

Related U.S. Application Data

(62) Division of application No. 10/420,781, filed on Apr. 23, 2003, now Pat. No. 7,196,761.

(30) Foreign Application Priority Data

Oct. 21, 2002    (KR)    .............................. 2002-64275

(51) Int. Cl.
G02F 1/136    (2006.01)
G02F 1/1343    (2006.01)
(52) U.S. Cl. ........................................ 349/51; 349/139
(58) Field of Classification Search ............. 349/41–43, 349/49–51, 139
See application file for complete search history.

(56) References Cited

U.S. PATENT DOCUMENTS

| | | | |
|---|---|---|---|
| 5,247,194 A | 9/1993 | Bae et al. ...................... 257/59 |
| 5,598,285 A | 1/1997 | Kondo et al. | |
| 5,838,037 A | 11/1998 | Masutani et al. | |
| 5,946,060 A | 8/1999 | Nishiki et al. | |
| 5,990,987 A | 11/1999 | Tanaka | |
| 6,026,653 A | 2/2000 | Nishida | |
| 6,097,454 A | 8/2000 | Zhang et al. | |
| 6,266,166 B1 | 7/2001 | Katsumata et al. | |
| 6,999,134 B2 | 2/2006 | Lee et al. | |
| 7,196,761 B2 * | 3/2007 | Lee ............................. 349/144 |

FOREIGN PATENT DOCUMENTS

| | | |
|---|---|---|
| JP | 53-117997 | 10/1978 |
| JP | 62-106666 | 5/1987 |
| JP | 62-169125 | 7/1987 |
| JP | 2-2522 | 1/1990 |
| JP | 6-90001 | 3/1994 |
| JP | 8-179341 | 7/1996 |
| JP | 9-5764 | 1/1997 |

(Continued)

*Primary Examiner*—Dung T. Nguyen
(74) *Attorney, Agent, or Firm*—Morgan Lewis & Bockius LLP

(57) ABSTRACT

An LCD array substrate includes a plurality of gate lines arranged in a first direction; a plurality of data lines arranged in a second direction to cross the plurality of gate lines; a semiconductor layer formed at overlapping regions of the gate lines and the data lines and extending a predetermined length from the overlapping regions over the gate lines; a drain electrode spaced apart from the overlapping regions of the gate and data lines and disposed partially in contact with the semiconductor layer, the drain electrode having ends extended beyond the semiconductor layer and the gate line; and a pair of pixel electrodes disposed on opposing sides of the gate line and electrically connected with the drain electrode.

16 Claims, 21 Drawing Sheets

FOREIGN PATENT DOCUMENTS

| | | |
|---|---|---|
| JP | 0-73101 | 3/1997 |
| JP | 2002-184991 | 6/2002 |
| JP | 2002-250937 | 9/2002 |
| KR | 10-2000-0004421 | 1/2000 |
| KR | 10-2000-0018887 | 4/2000 |
| WO | WO 02/01286 * | 1/2002 |

* cited by examiner

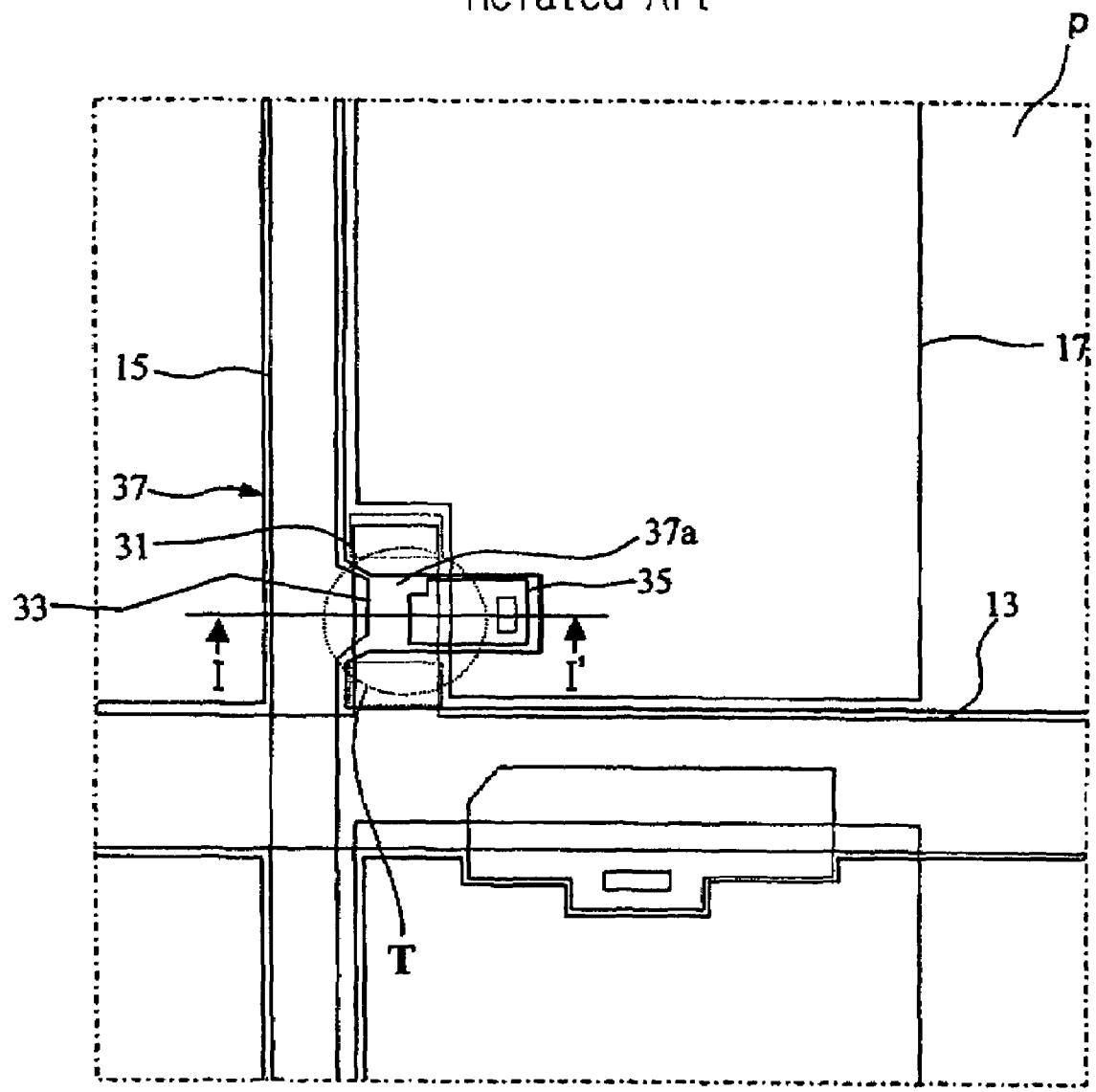

Fig.3A
Related Art
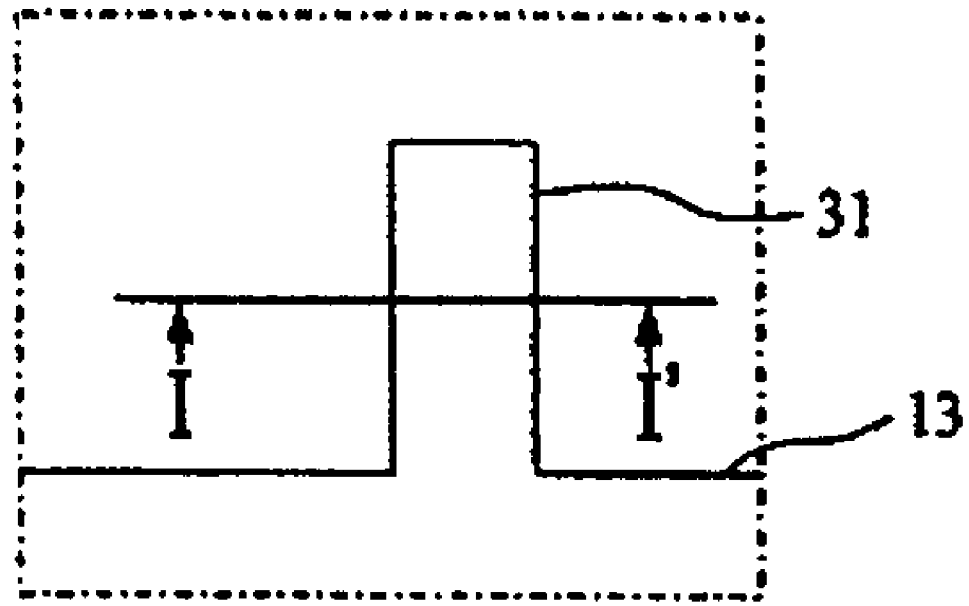
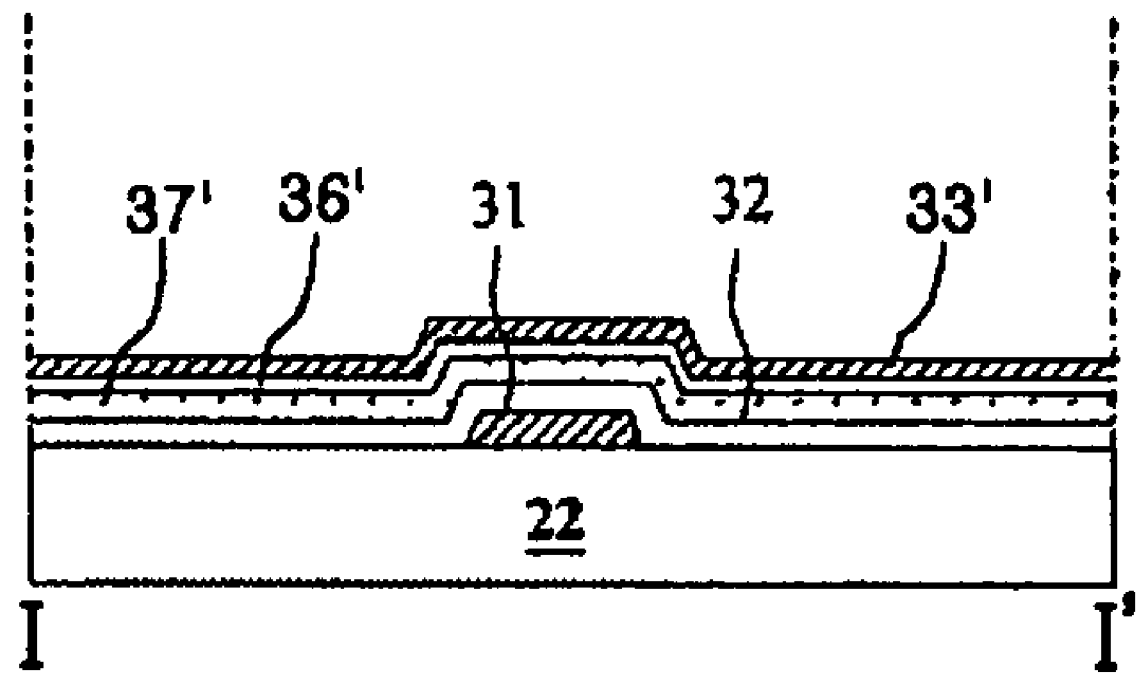

Fig.3B
Related Art
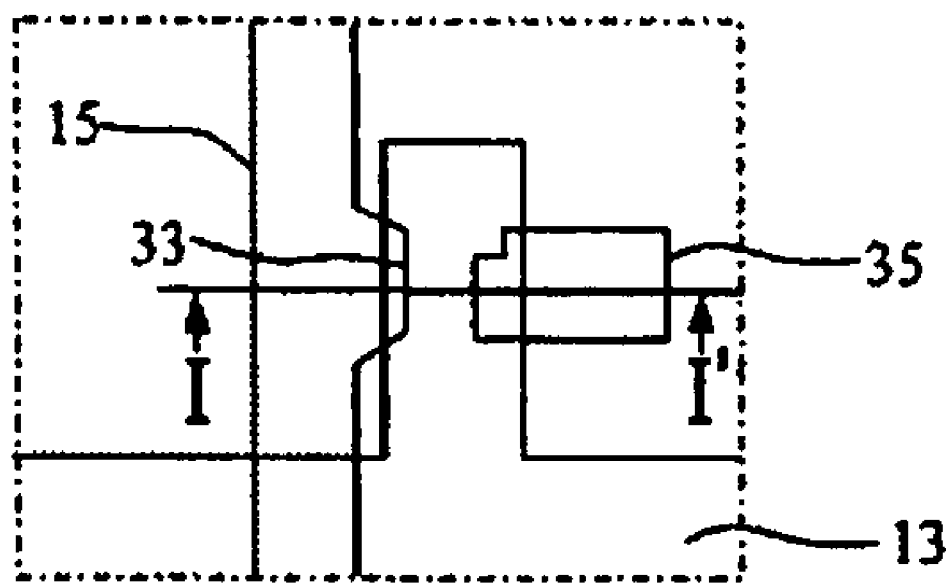
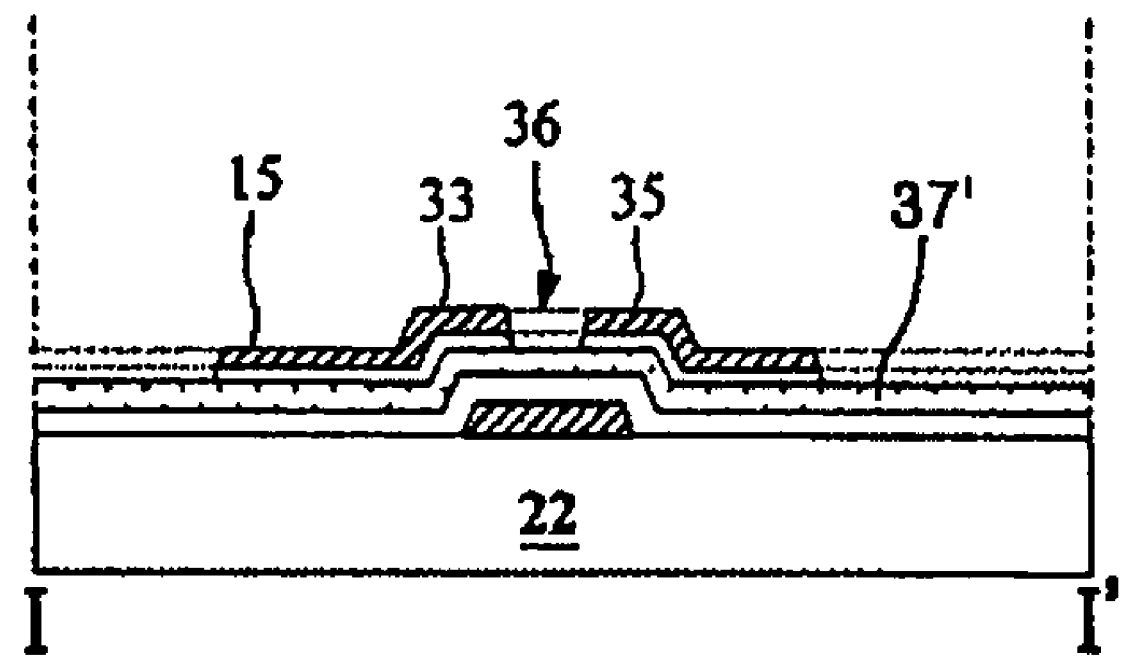

Fig.3C
Related Art
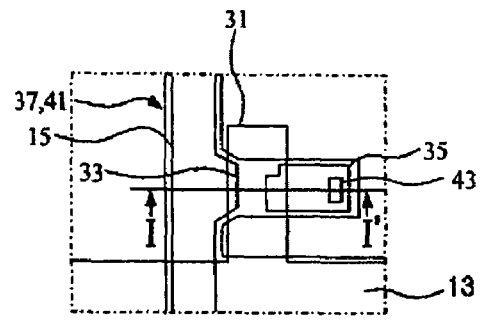
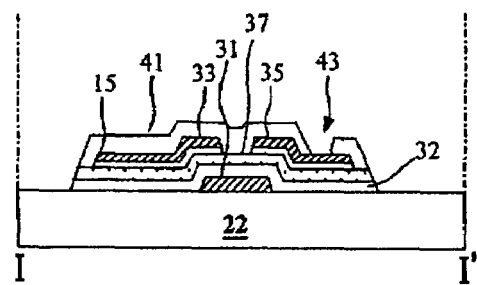
Fig.3D
Related Art
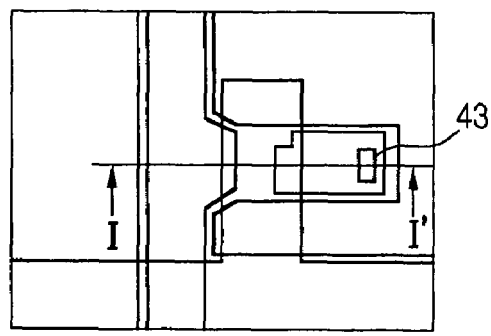
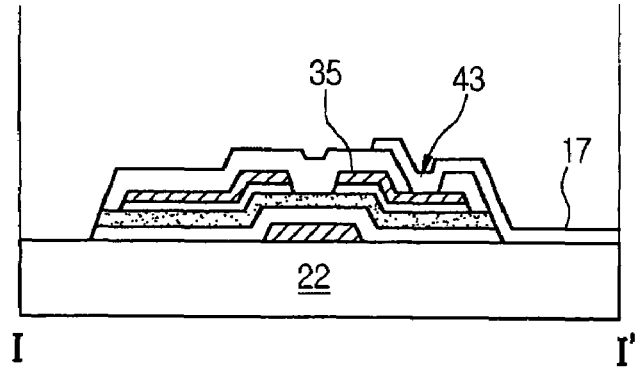

Fig.4A
Related Art
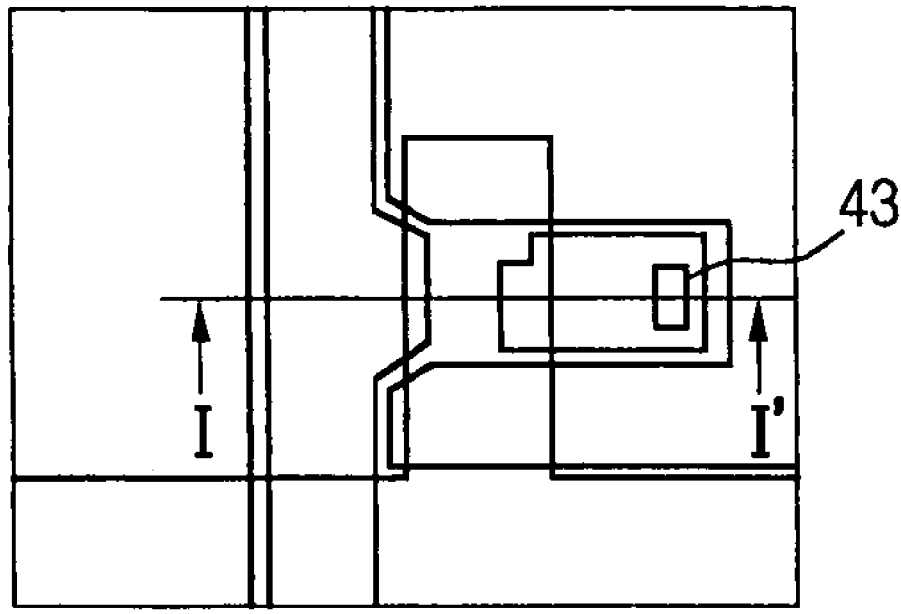
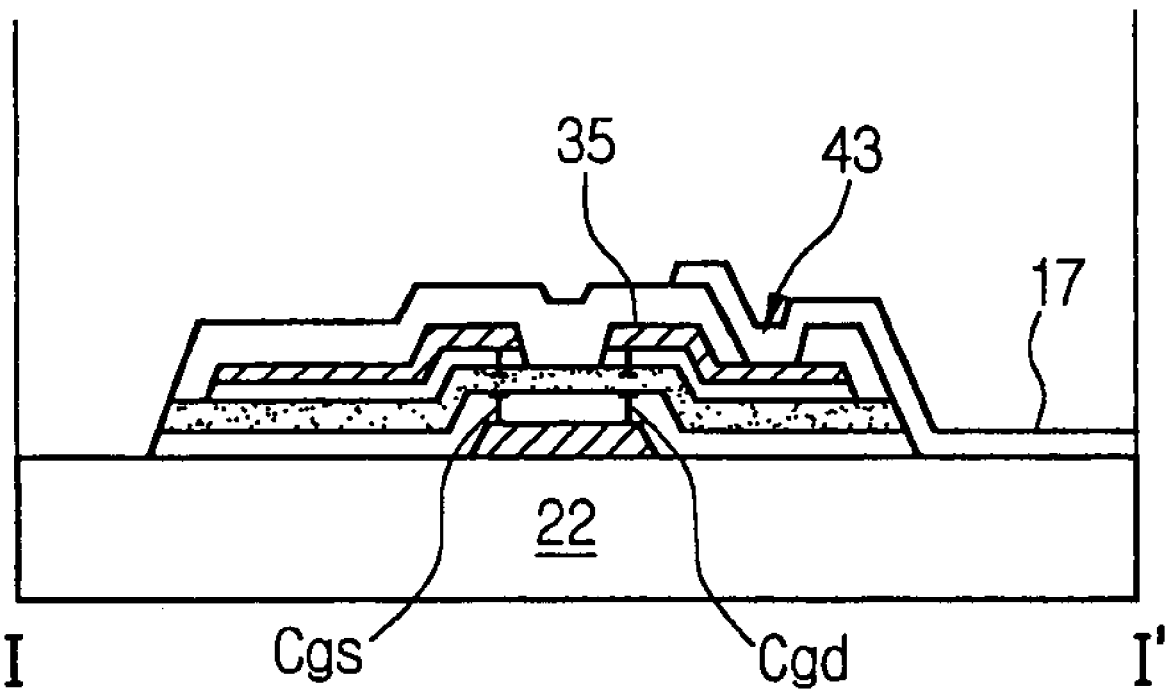

Fig.4B
Related Art
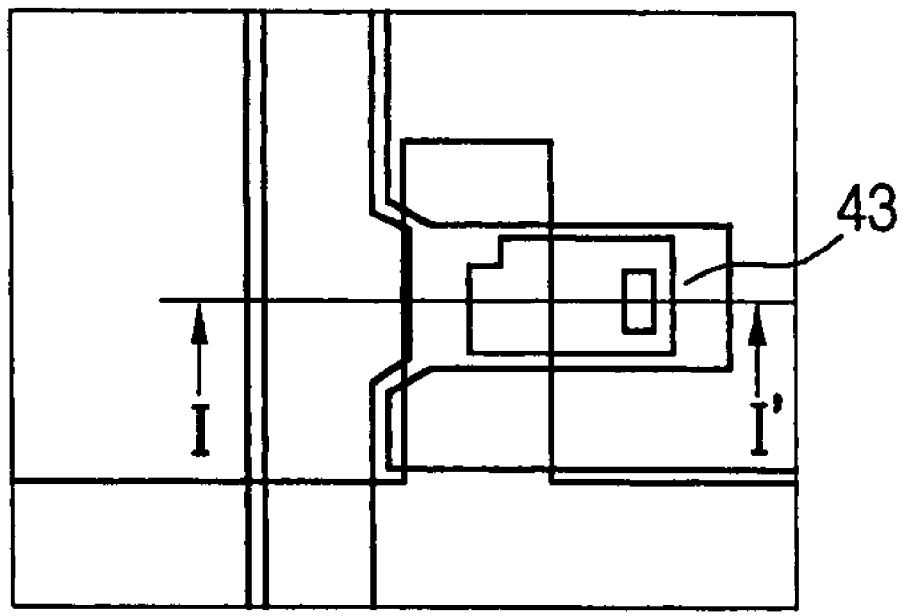
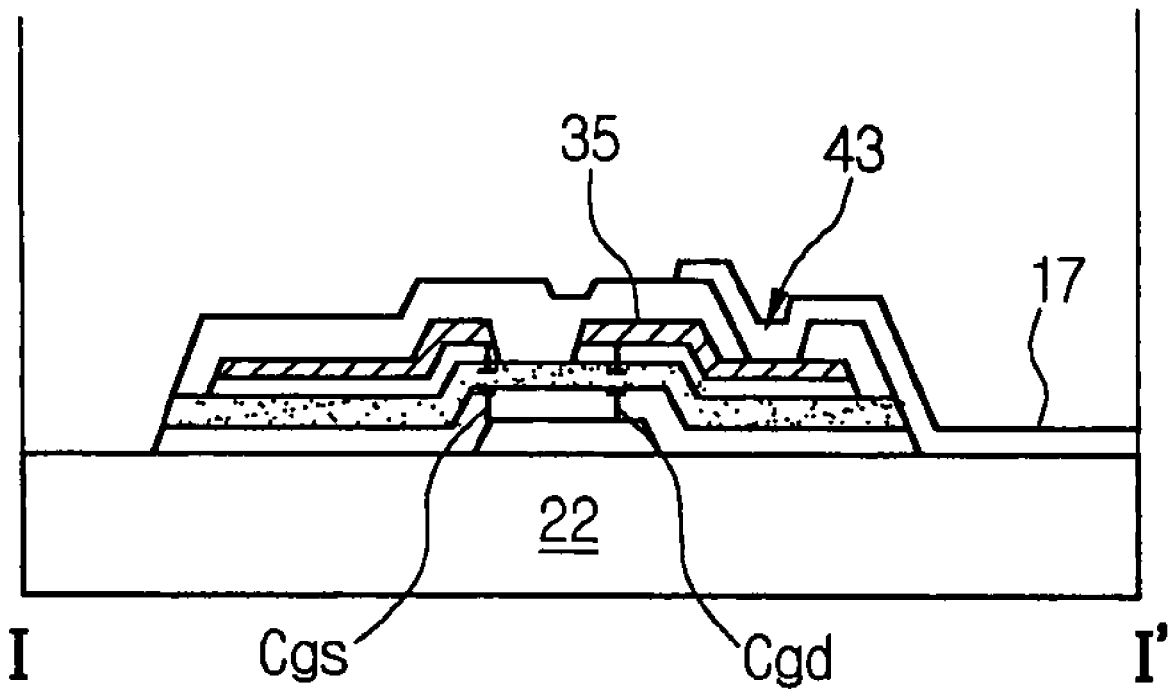

Fig.4C
Related Art
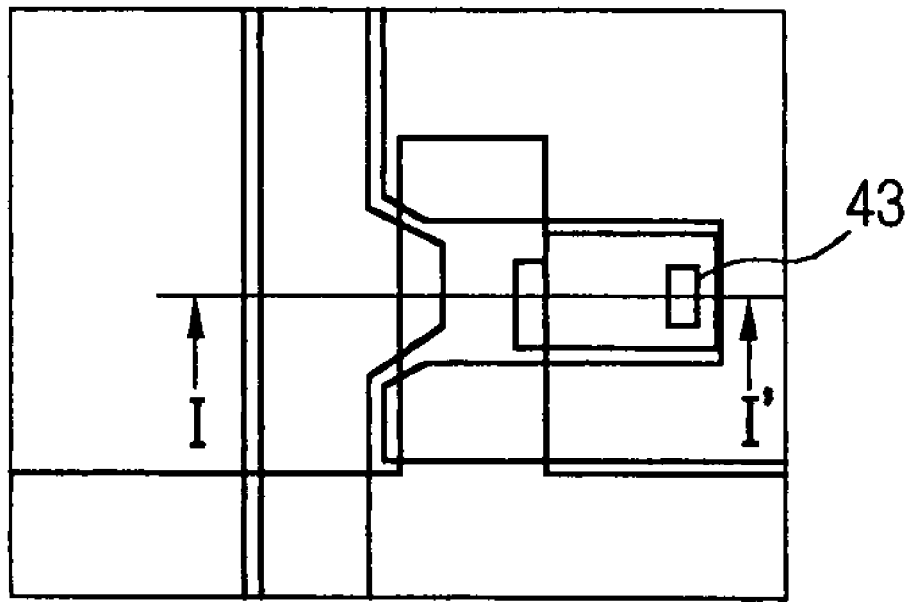
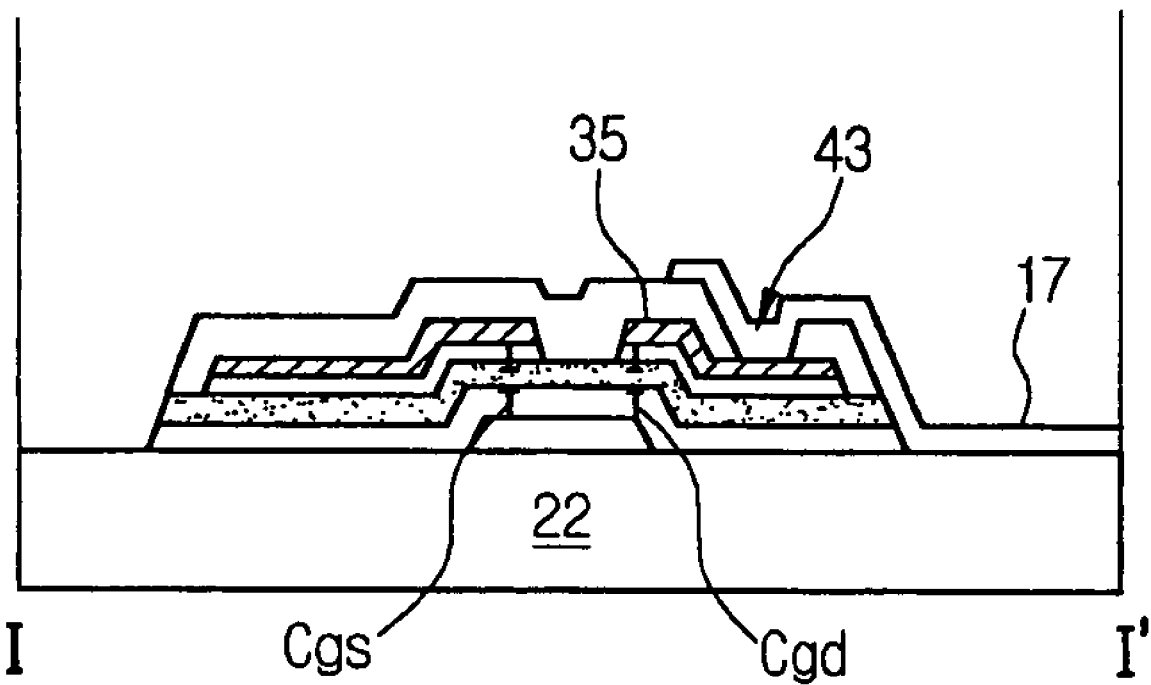

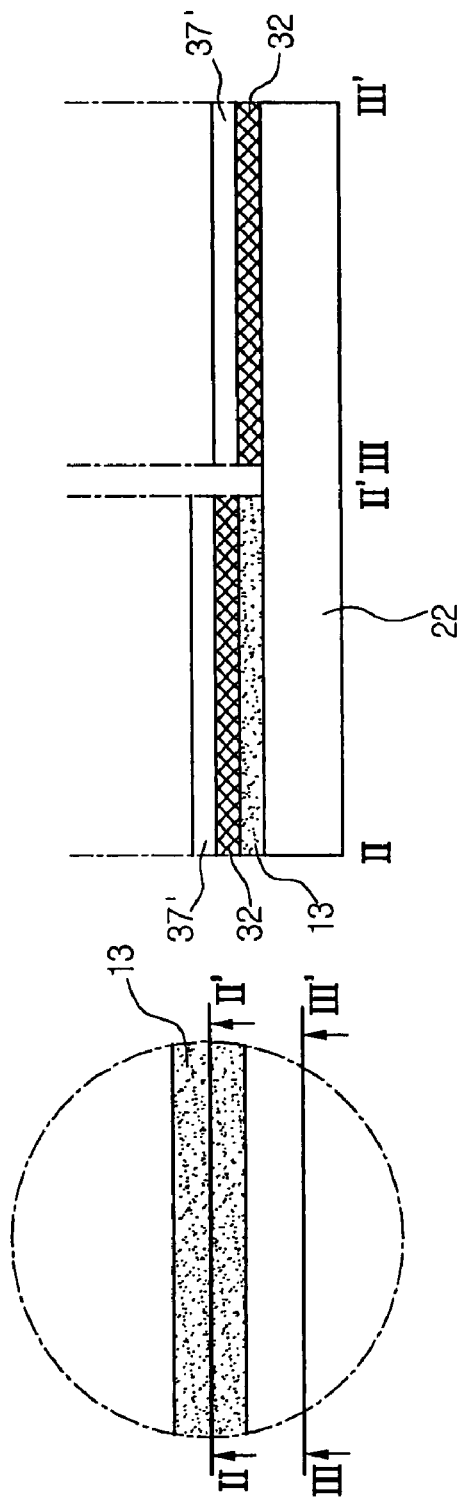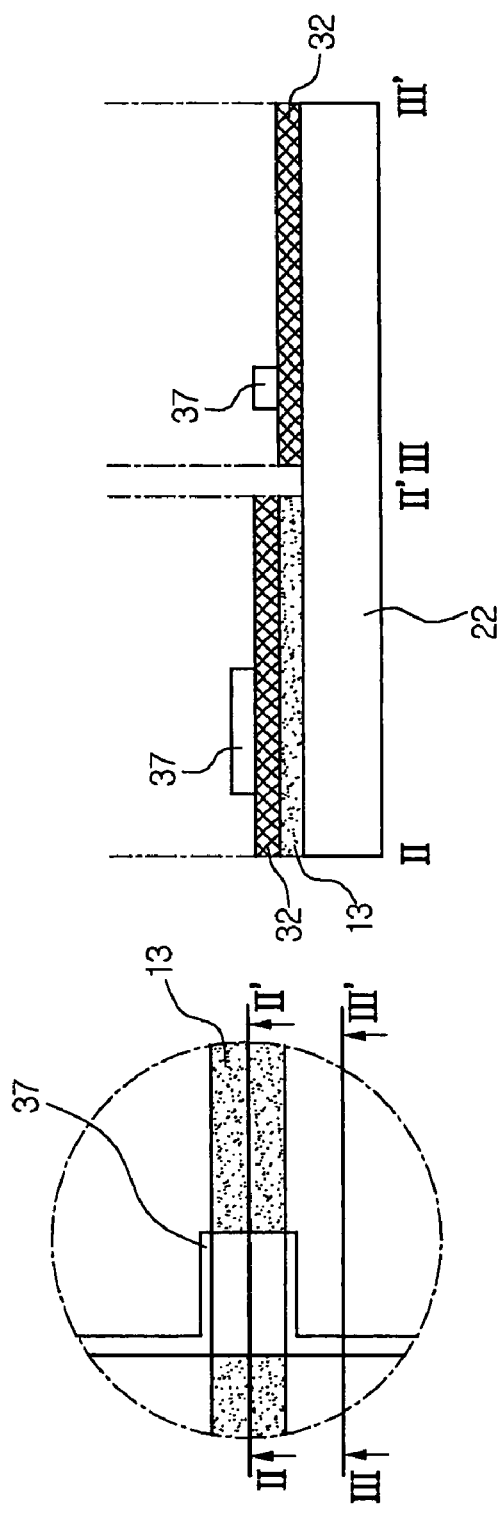
Fig.6A
Fig.6B

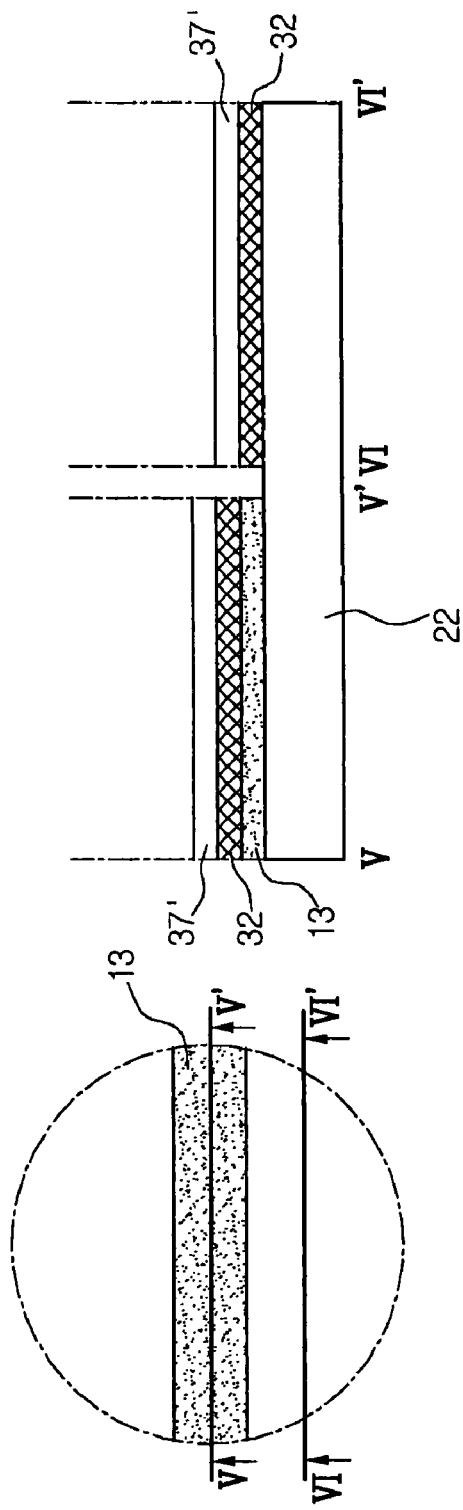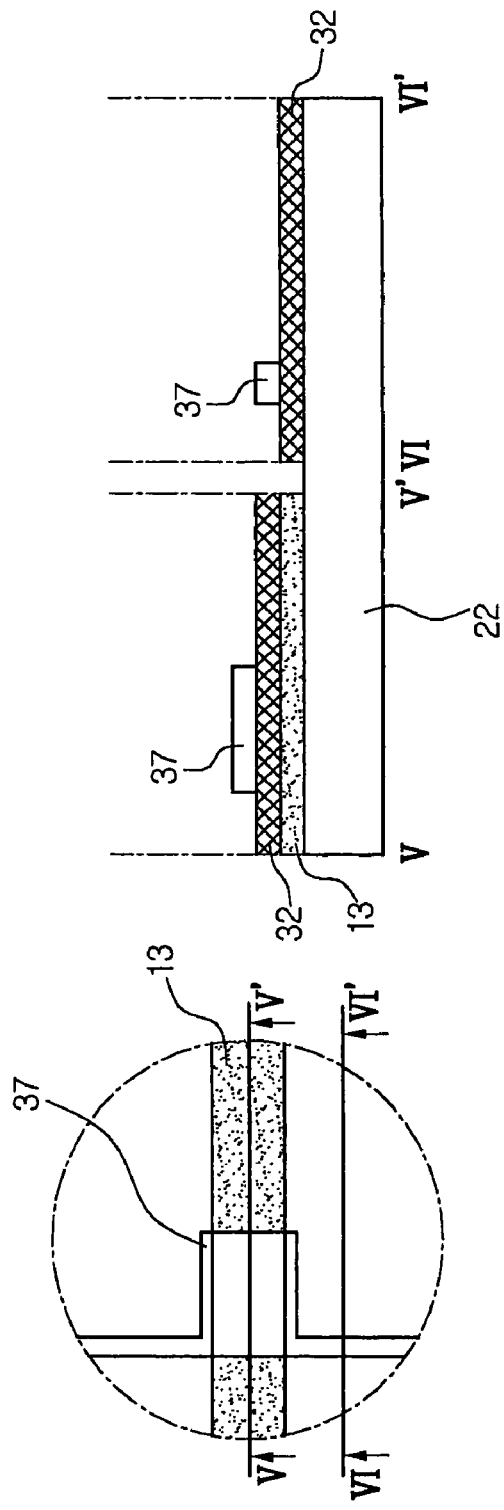

Fig. 10B
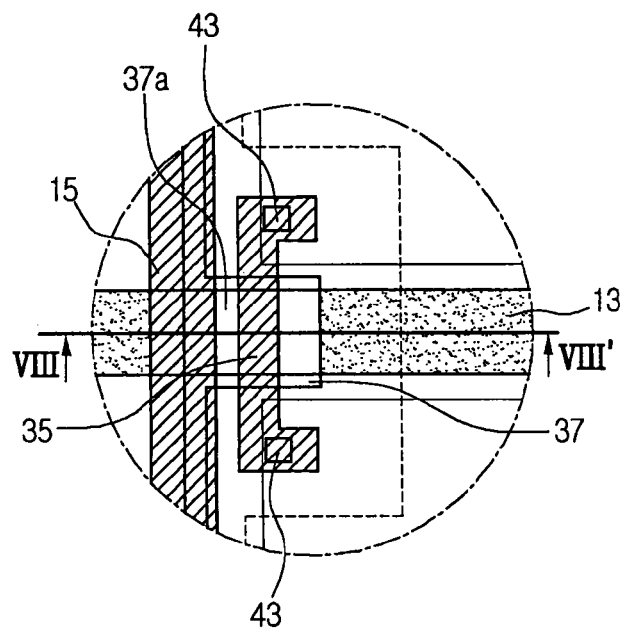
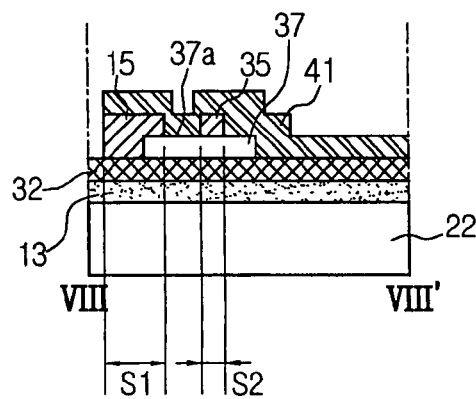
Fig. 10C
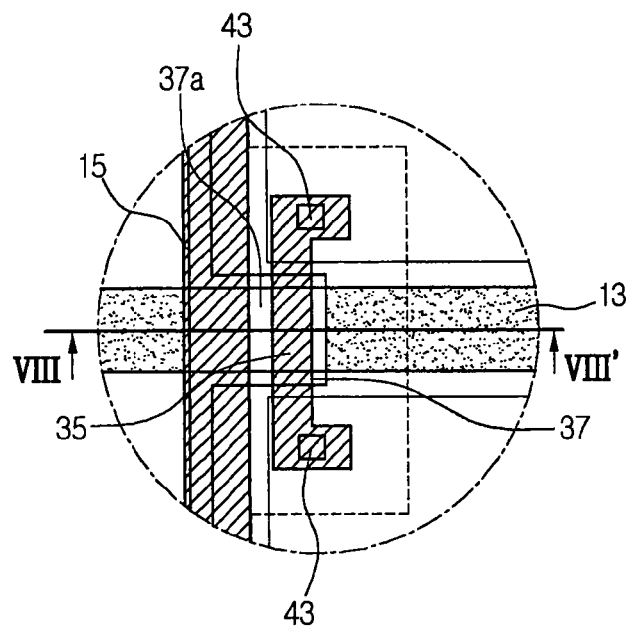
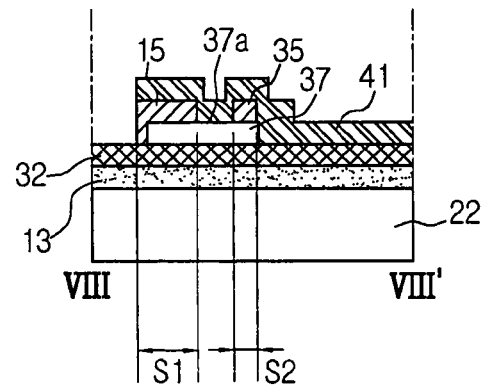

Fig. 10D
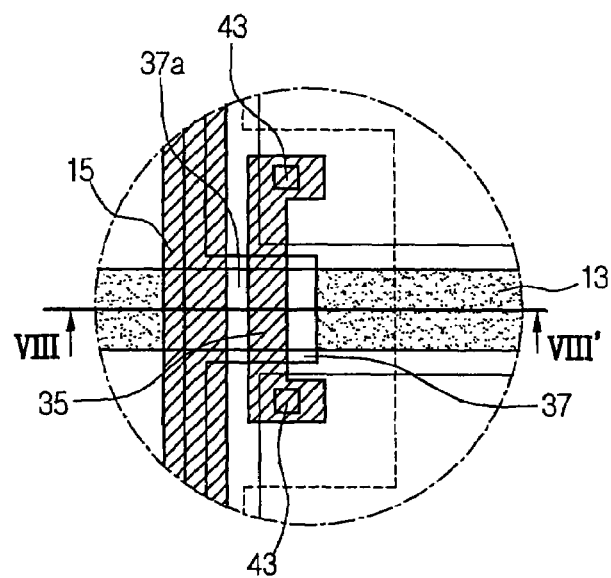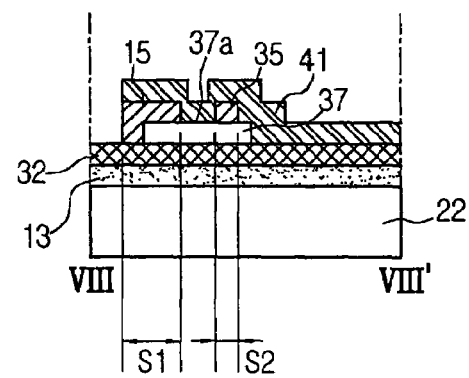
Fig. 10E
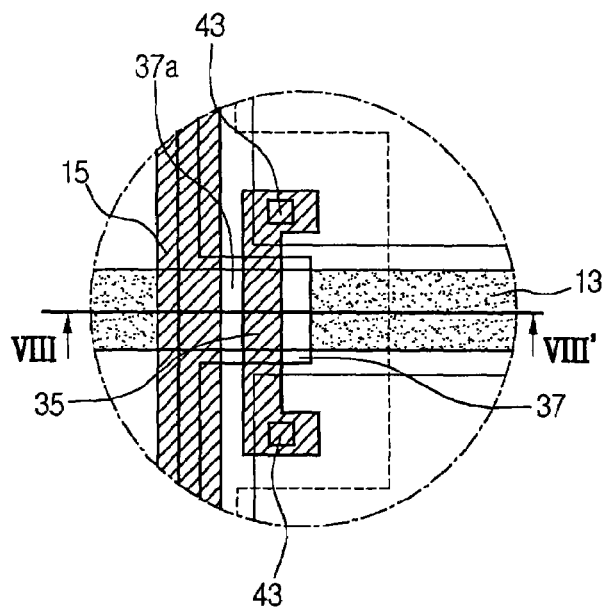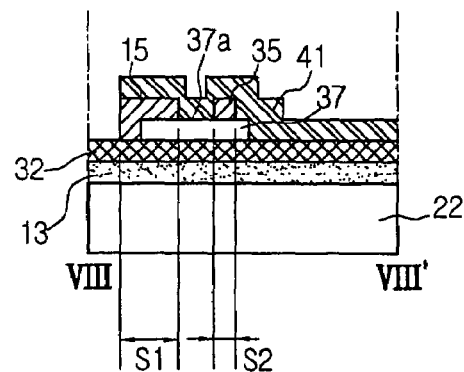

LCD ARRAY SUBSTRATE AND FABRICATION METHOD THEREOF

This is a divisional application of U.S. patent application Ser. No. 10/420,781, filed Apr. 23, 2003, now U.S. Pat. No. 7,196,761 which is hereby incorporated by reference. This application also claims the benefit of Korean Patent Application No. 2002-64275 filed in Korea on Oct. 21, 2002, which is hereby incorporated by reference.

BACKGROUND OF THE INVENTION

1. Field of the Invention

The present invention relates to a liquid crystal display (LCD), and more particularly, to an LCD array substrate in which a thin film transistor region is arranged at a center side portion of a unit pixel and data line and gate line are substituted for source electrode and gate electrode, and a fabrication method thereof.

2. Discussion of the Related Art

Generally, a liquid crystal display operates by the optical anisotropy and polarization of a liquid crystal material therein. Since the liquid crystal material includes liquid crystal molecules each having a thin and long structure, the liquid crystal material has a directionality according to the arrangement of the liquid crystal molecules. Hence, the arrangement direction of the liquid crystal molecules can be controlled by applying an external electric field to the liquid crystal. As the arrangement direction of the liquid crystal molecules are changed by applying an electric field, light polarization caused by the optical anisotropy of the liquid crystal material is modulated to display image information.

Liquid crystal material can be classified into positive (+) liquid crystal having a positive dielectric anisotropy and negative (−) liquid crystal having a negative dielectric anisotropy depending on its electrical properties. Liquid crystal molecules having a positive dielectric anisotropy are arranged such that their long axes are parallel with the direction of an applied electric field, and liquid crystal molecules having a negative dielectric anisotropy are arranged such that their long axes are normal to the direction of an applied electric field.

Nowadays, an active matrix LCD in which thin film transistors and pixel electrodes connected to the thin film transistors are arranged in a matrix configuration are widely being used because of their high resolution and superior moving picture reproducing capability. Hereinafter, a structure of a liquid crystal panel that is a main element of the LCD will be reviewed.

FIG. 1 is a partial exploded perspective view of a general LCD. Referring to FIG. 1, a general color LCD includes an upper substrate 5 and a lower substrate 22. The upper substrate 5 includes a black matrix 6, a color filter 7 having sub-color filters of red (R), green (G), and blue (B), and a transparent common electrode 18 formed on the color filter 7. The lower substrate 22 includes pixel regions (P), pixel electrodes 17 formed on the pixel regions (P), and an array interconnection line including switching elements (T). Between the upper substrate 5 and the lower substrate 22, a liquid crystal layer 15 is interposed as described above.

The lower substrate 22 is called an "array substrate." On the lower substrate 22, a plurality of thin film transistors functioning as switching elements are arranged in a matrix configuration, and a gate line 13 and a data line 15 are formed to cross the plurality of thin film transistors. The pixel regions (P) are defined by the gate lines 13 and the data lines 15 crossed with the gate lines 13. The pixel electrode 17 formed on the pixel region (P) is made of a transparent conductive material, such as indium-tin-oxide (ITO), having superior light transmittance. The LCD 11 constructed as above displays images when liquid crystal molecules of the liquid crystal layer 14 on the pixel electrode 17 are aligned by a signal voltage applied from the thin film transistor to control the amount of light passing through the liquid crystal layer 14.

Also, the LCD array substrate 22 constructed as above is formed by a deposition process, a photolithography process (hereinafter referred to as a "photo-process"), an etch process and the like. The photo-process utilizes a principle in which when photoresist (PR) is exposed to light, a chemical reaction occurs to change the property of the PR. In the photo-process, light is selectively irradiated onto the PR through a mask of a desired pattern, thereby forming the same pattern as the pattern of the mask. The photo-process includes a PR coating step in which a photoresist corresponding a general picture film is coated on, an exposure step in which light is selectively irradiated onto the PR using a mask, and a developing step in which the exposed portion of the PR is removed to form a pattern.

FIG. 2 is a partially magnified plan view of pixels of a related art LCD array substrate. Referring to FIG. 2, a pixel region (P) is defined by a pair of gate lines 13 and a pair of data lines 15 crossed with the pair of gate lines 13. At a cross point of the data line 15 and the gate line 13, a thin film transistor (T) having gate electrode 31, source electrode 33, and drain electrode 35 is formed. The source electrode 33 and the drain electrode 35 are spaced apart by a predetermined interval from each other on the gate electrode 31, and an active channel (semiconductor layer) 37a is exposed between the source electrode 33 and the drain electrode 35.

As a scanning pulse is applied to the gate electrode 31 of the thin film transistor (T) and the voltage of the gate electrode 31 is increased, the thin film transistor (T) is turned ON. At this time, if a liquid crystal driving voltage is applied to the liquid crystal material via drain and source regions of the thin film transistor (T) from the data line 13, pixel capacitance, which includes liquid crystal capacitance and storage capacitance, is charged. By repeating the above operation, a voltage corresponding to a video signal for every frame time is applied repeatedly to the pixel capacitance of the front surface of the LCD panel. Finally, if an arbitrary pixel is switched by the thin film transistor, the switched pixel passes light from the lower light source.

FIGS. 3A to 3D are plan and sectional views schematically showing a process to fabricate the LCD array substrate of FIG. 2. In FIGS. 3A to 3D, the sectional views are taken along line I-I' of FIG. 2. Here, while FIG. 3 shows that the array substrate is formed by a process requiring four masks, the array substrate may be formed by a process requiring five masks. If the array substrate is formed by a process using five masks, the semiconductor layer 37 may not be formed below the data line 15.

FIG. 3A corresponds to a first mask step in which metal, such as copper or the like, is deposited and patterned to form the gate line 13 and the gate electrode 31. Next, a gate insulating film 32 and an amorphous semiconductor (silicon) layer 37', an impurity-doped amorphous semiconductor (silicon) layer 36', and a conductive metal layer 33' are deposited on the substrate on which the gate line 13 and the like are already formed.

FIG. 3B corresponds to a second mask step in which the conductive metal layer 33' is patterned to form the data line 15 crossing with the gate line 13, the source electrode 33 is protruding perpendicularly from the data line 15 by a predetermined area, and the drain electrode 35 spaced apart by a predetermined interval from the source electrode 33. Next, the exposed impurity-doped amorphous silicon 36' is etched using the patterned metal layer as an etch stopper such that the amorphous silicon layer 37' is exposed between the data line and the drain electrode.

FIG. 3C corresponds to a third mask step in which a passivation layer 41 of an electrically insulating material is formed on the substrate on which the data line 15 and the like are formed. The passivation layer 41 is patterned to form drain contact holes 43 for the drain electrode 35. Portions of the passivation layer 41 are also removed from the pixel region (P) except for upper portions of the gate electrode 31, the source electrode 33, the drain electrode 35, upper portions of the gate line 13, and upper portions of the data line 15. While the passivation layer 41 is patterned, the semiconductor layer 37 and the gate insulating film 32 below the passivation layer are patterned at the same time. Accordingly, below the patterned passivation layer 41, the semiconductor layer 37 is etched in the same pattern as the passivation layer 41.

FIG. 3D corresponds to a fourth mask step in which the pixel electrode 17 contacting the drain electrode 35 through the drain contact holes 43 is formed.

Thus, the related art array substrate is formed by the foregoing process and the screen size of the array substrate is greater than that of the exposure mask used in the photo-process. Hence, during the exposure step, the screen of the array substrate is divided into a plurality of shots and is repeatedly exposed, and such a repeated process is further generalized as the large-sized LCDs are mass-produced in recent years. However, limitations in the preciseness of the exposure equipment causes reduced picture quality of the LCD by the stitch failure that the misalignment between the shots occurs.

Also, in the case of forming the data lines defining the pixel region crossing with the gate line, the source electrode and the drain electrode spaced apart by a certain interval from the source electrode by patterning the conductive metal layer using the mask step of FIG. 3B, the limitation in the preciseness of the exposure equipment or the like causes the mask not to be precisely accorded with an intended specification and, thus, to be deviated from the correct position by some degree. As a result, an overlay failure where the gate electrode and the source/drain electrode are not regularly overlapped every pixel region occurs so that picture quality of the LCD is reduced.

With reference to FIG. 4, the phenomenon where the picture quality is reduced in the LCD is described in more detail. FIGS. 4A to 4C illustrate stitch/overlay failures according to the contact area of the source/drain electrode with the gate electrode.

In FIGS. 4A to 4C, the stitch failure is a problem occurring when the alignment degree between shots on the same layer is not constant, and the overlay failure is a problem occurring due to a misalignment of the mask between different layers. However, since the result of the stitch failure is the same as that of the misalignment failure, their descriptions are made with reference to the same drawings of FIGS. 4B and 4C.

FIG. 4A is plan view and sectional view of a thin film transistor region where a stitch/overlay failure does not occur.

Referring to FIG. 4A, parasitic capacitances $C_{gs}$ and $C_{gd}$ are generated due to the existence of the overlapping regions between the gate electrode 31 and the source electrode 33 and between the gate electrode 31 and the drain electrode 35. The parasitic capacitance changes the liquid crystal voltage by $\Delta V$ when the thin film transistor is turned on, so that a voltage difference is caused between the initially applied voltage and a voltage applied to the liquid crystal. The $\Delta V$ is approximately expressed by equation 1 below:

$$\Delta V = \frac{C_{gd}}{C_{gd} + C_{LC} + C_{ST}} \Delta V_g \qquad (1)$$

where, $C_{gd}$ is a parasitic capacitance, $C_{LC}$ is a liquid crystal capacitance, $C_{ST}$ is a storage capacitance, and $\Delta V_g$ is a voltage different between gate voltages in ON and OFF states, $V_{gh}$ and $V_{gl}$.

Thus, due to the voltage difference $\Delta V$, a phenomenon where the picture undesirably becomes dark and bright during display, (i.e., flicker) occurs. The flicker is overcome by moving the common voltage ($V_{com}$) from the center of the data signal voltage by $\Delta V$ such that a direct current (dc) component is deleted while the LCD is operated. In other words, if $\Delta V$ is generated in the respective pixels and is constant, the flicker can be overcome by moving the common voltage a constant amount.

As shown in FIG. 4A, if the parasitic capacitances with respect to the respective thin film transistor regions in a plurality of pixels are constant, this problem can be solved. However, if the parasitic capacitances with respect to the respective thin film transistor regions in a plurality of pixels are not constant due to a stitch and/or overlay failure, the flicker cannot be overcome by moving the common voltage ($V_{com}$) a constant amount.

FIGS. 4B and 4C are plan view and sectional view of a thin film transistor region where the stitch/overlay failure occurs.

If the stitch failure (i.e., misalignment between shots occurs) or the overlay failure (i.e., misalignment of masks occurs between different layers), a difference occurs between the overlapping region between the gate electrode 31 and the source electrode 33 and the overlapping region between the gate electrode 31 and the drain electrode 35. As a result, a difference between the parasitic capacitances $C_{gs}$ and $C_{gd}$ is caused. In other words, as shown in FIG. 4B, in a state that the side of the drain electrode 35 is misaligned toward the side of the source electrode 33, the capacitor $C_{gd}$ between the gate and the drain becomes large. Meanwhile, as shown in FIG. 4C, in a state that the side of the source electrode 33 is misaligned toward the drain electrode 35, the capacitance $C_{gd}$ between the gate and the drain becomes small.

As aforementioned, if a difference between the parasitic capacitances occurs for every pixel region, which represents that the capacitance $C_{gd}$ is varied in the $\Delta V$, the value of the $\Delta V$ becomes not constant. Accordingly, it is impossible to prevent the flicker by only moving the common voltage ($V_{com}$) a constant amount as with the related art. Therefore, the array substrate produced by the related art fabrication method of the LCD array substrate has a difficulty in overcoming a picture imbalance in an LCD caused by the stitch and/or overlay failure.

SUMMARY OF THE INVENTION

Accordingly, the present invention is directed to an LCD array substrate and fabrication method thereof that substantially obviates one or more problems due to limitations and disadvantages of the related art.

An object of the present invention is to provide an LCD array substrate and fabrication method thereof that removes a change in parasitic capacitance due to overlay and stitch failure.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an LCD array substrate comprises a plurality of gate lines arranged in a first direction; a plurality of data lines arranged in a second direction to cross the plurality of gate lines; a semiconductor layer formed at overlapping regions of the gate lines and the data lines and extending a predetermined length from the overlapping regions over the gate lines; a drain electrode spaced apart from the overlapping regions of the gate and data lines and disposed partially in contact with the semiconductor layer, the drain electrode having ends extended beyond the semiconductor layer and the gate line; and a pair of pixel electrodes disposed on opposing sides of the gate line and electrically connected with the drain electrode.

In another aspect, an LCD array substrate comprises a plurality of gate lines arranged in a first direction; a plurality of data lines arranged in a second direction to cross the plurality of gate lines; a semiconductor layer formed at overlapping regions of the gate lines and the data lines and extending a predetermined length from the overlapping regions over the gate lines; a drain electrode spaced apart from the overlapping regions of the gate and data lines and disposed partially in contact with the semiconductor layer, the drain electrode having ends extended beyond sides of the gate line; and a pixel electrode electrically connected with the ends of the drain electrode and overlapping at least a portion of the gate line.

In another aspect, a fabrication method of an LCD array substrate comprises the steps of forming a plurality of gate lines on a substrate; sequentially forming a gate insulating film and a semiconductor layer on the substrate on which the gate lines are formed; forming a plurality of data lines and a drain electrode on the semiconductor layer; forming a passivation layer on an entire surface of the substrate having the data lines, the drain electrode, the gate lines, and the semiconductor layer; forming a contact hole in the passivation layer formed on both ends of the drain electrode; and forming a pair of pixel electrodes electrically connected with the drain electrode through the contact hole.

In another aspect, a fabrication method of an LCD array substrate comprises the steps of forming a plurality of gate lines on a substrate; sequentially forming a gate insulating film and a semiconductor layer on the substrate on which the gate lines are formed; forming a plurality of data lines and a drain electrode on the semiconductor layer; forming a passivation layer on an entire surface of the substrate having the data lines, the drain electrode, the gate lines, and the semiconductor layer; forming a contact hole in the passivation layer formed on both ends of the drain electrode; and forming a pixel electrode electrically connected with the drain electrode through the contact hole and overlapping a corresponding one of the gate lines.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention. In the drawings:

FIG. 2 is a partially magnified plan view of pixels of a related art LCD array substrate;

FIGS. 3A to 3D are plan and sectional views schematically showing a process for fabricating the LCD array substrate of FIG. 2 with the sectional views taken along line I-I' of FIG. 2;

FIGS. 4A to 4C are plan and sectional reviews illustrating stitch/overlay failures according to the contact area of the source/drain electrode with the gate electrode in the LCD array substrate of FIG. 2 with the sectional views taken along line I-I';

FIGS. 6A to 6E are plan and sectional views schematically showing a process flow to obtain the LCD array substrate of FIG. 5 with the sectional views taken along lines II-II' and III-III' of FIG. 5;

FIGS. 8A to 8E are plan and sectional views schematically showing a process flow to obtain the LCD array substrate of FIG. 7 with the sectional views taken along lines V-V' and VI-VI' of FIG. 7;

FIGS. 10A to 10E are magnified plan views illustrating the thin film transistor structure to overcome the stitch/overlay failure according to the present invention.

DETAILED DESCRIPTION OF THE PREFERRED EMBODIMENTS

Reference will now be made in detail to the preferred embodiments of the present invention, examples of which are illustrated in the accompanying drawings.

Figure 1:
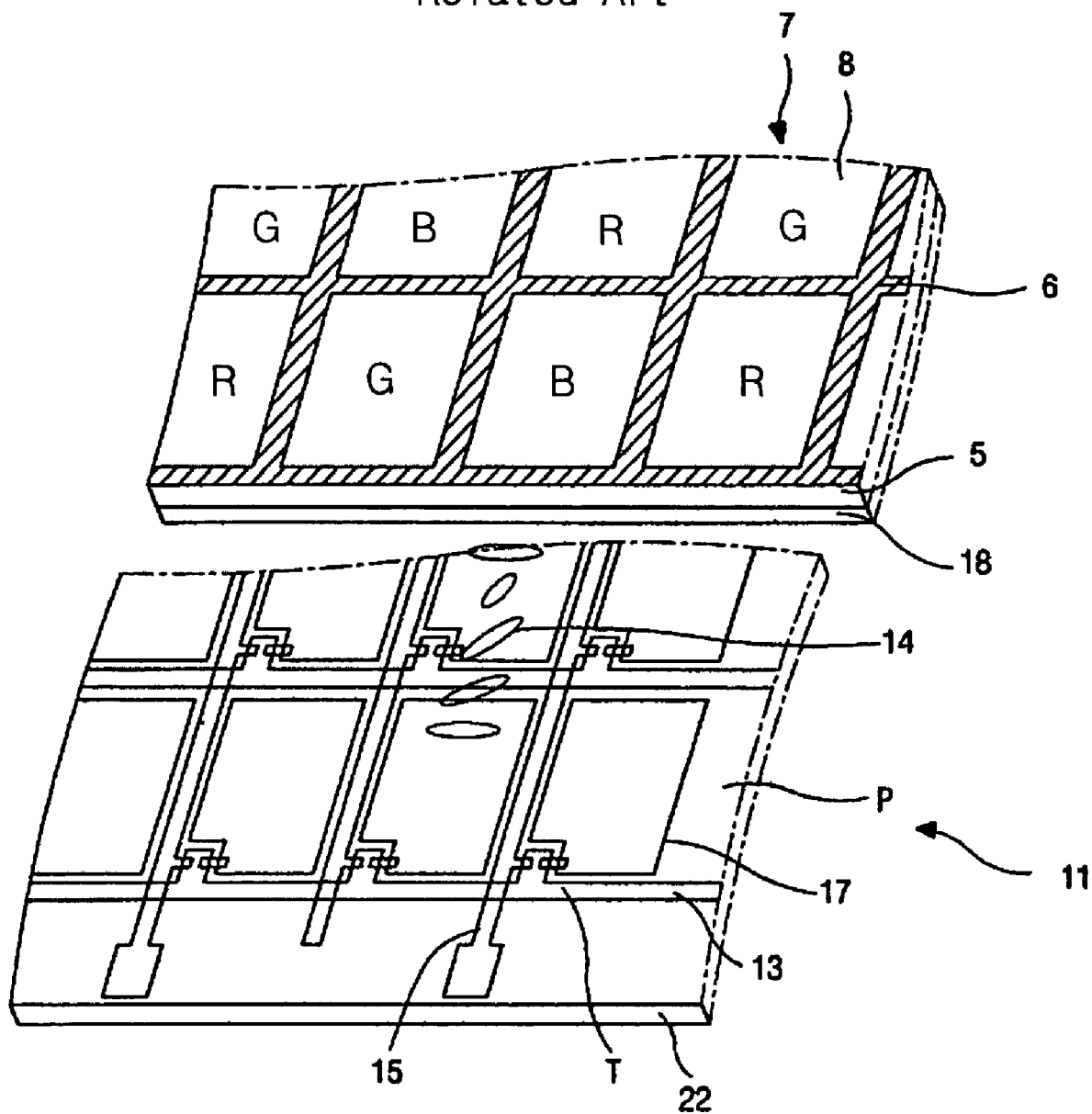
FIG. 1 is a partial exploded perspective view of a general liquid crystal display.
Figure 5:
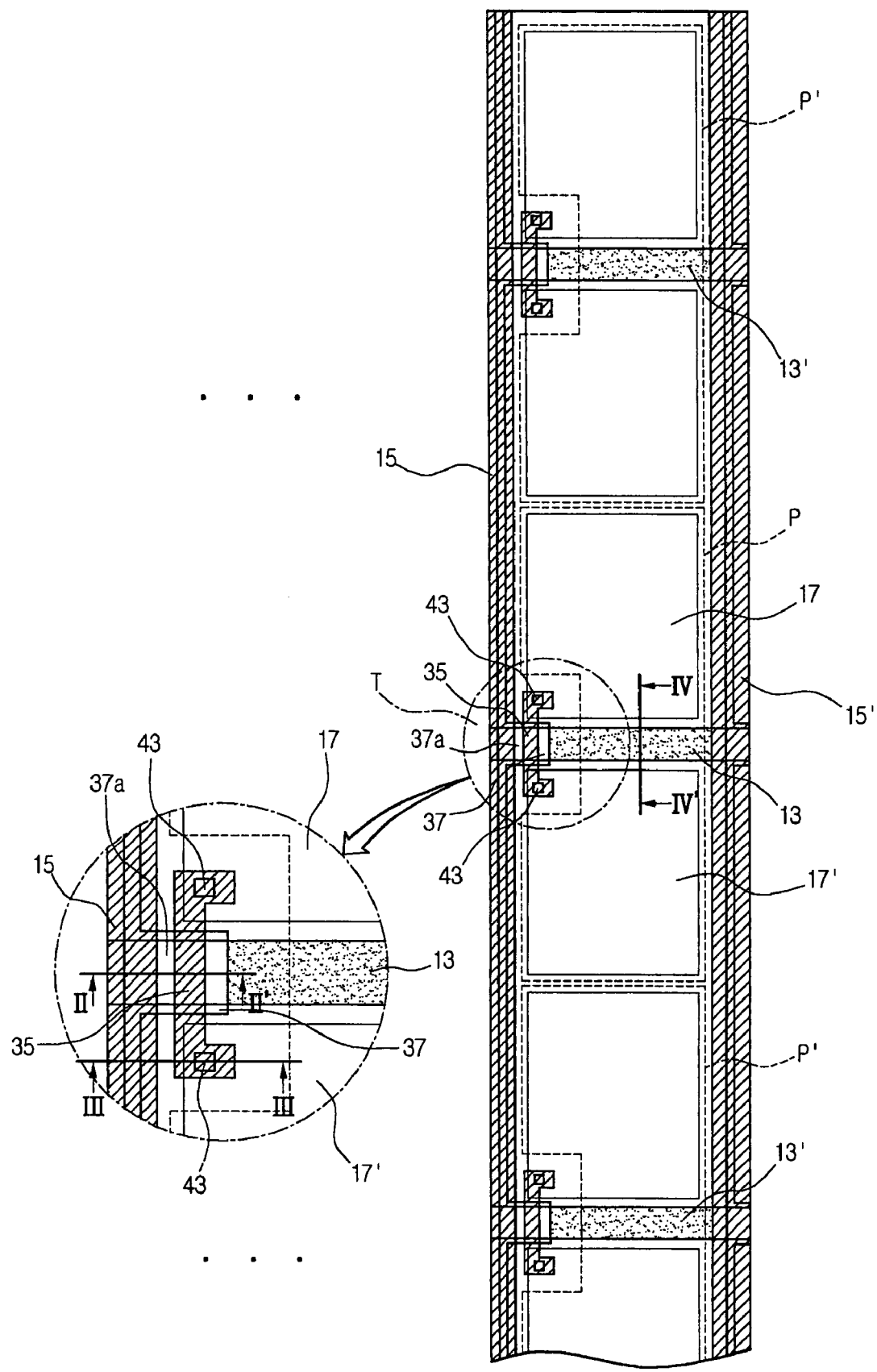
FIG. 5 is a partially magnified plan view of an LCD array substrate according to an exemplary embodiment of the present invention.

FIG. 5 is a partially magnified plan view of an LCD array substrate according to an exemplary embodiment of the present invention.

Referring to FIG. 5, a unit pixel of an LCD array substrate is formed within a pixel region (P) defined by a pair of data lines 15, 15' that are adjacent to each other in a horizontal direction and upper and lower regions of a gate line 13 crossing the pair of data lines 15, 15'. At a cross point of the data line 15 and the gate line 13, a thin film transistor (T) is formed. Here, the upper and lower regions represent regions designed such that the pixel region (P) defined by the gate line 13 is not overlapped with another pixel regions P' defined by the gate lines 13' adjacent to the gate line 13 in upward and downward directions.

Also, the thin film transistor (T) includes the gate line 13 and the data line 15 at the cross point, and a drain electrode 35 spaced apart by a predetermined distance from the data line 15. Between the gate line 13 and the data line 15 at the cross point, the semiconductor layer 37 is formed. The semiconductor layer 37 protrudes by a predetermined amount on the gate line 13. The gate line 13 and the data line 15 at the cross point directly functions as the gate electrode and the source electrode of the thin film transistor. Additionally, the data line 15 and the drain electrode 35 are spaced apart by a predetermined interval on the semiconductor layer 37 formed on the gate line 13. An exposed portion of the semiconductor layer 37 between the data line 15 and the drain electrode 35 functions as a channel 37a through which a signal is transferred from the data line 15 to the drain electrode 35.

The drain electrode 35 is formed such that both ends thereof are located outside the semiconductor layer 37 and are respectively connected with a pair of pixel electrodes 17, 17'. The pair of pixel electrodes 17, 17' are formed within the aforementioned pixel region (P), spaced apart by predetermined intervals from the gate line 13 and the data lines 15, 15' adjacent to each other in the horizontal direction, thereby forming a single unit pixel.

In more detail, as a scanning pulse is applied to the gate line 13 of the thin film transistor (T) and the thin film transistor (T) is turned on, a liquid crystal driving voltage is applied to the pair of pixel electrodes 17, 17' via the channel 37a and the drain electrode 35 of the thin film transistor (T) from the data line 13. At this time, the same liquid crystal driving voltage is applied to the pair of pixel electrodes 17, 17' respectively, which indicates that the pair of pixel electrodes 17, 17' functions as a unit pixel.

FIGS. 6A to 6E are plan and sectional views schematically showing a fabrication process for the LCD array substrate of FIG. 5. Here, the sectional views are taken along lines II-II' and III-III' of FIG. 5. FIG. 6 shows the array substrate formed by a process using five masks but the array substrate may be formed by a process using four masks. Also, FIG. 6 shows that the semiconductor layer 37 is formed below the data lines 15, 15'. However, the semiconductor layer 37 may not be formed below the data lines 15, 15' which do not form the thin film transistor (T).

FIG. 6A corresponds to a first mask step in which metal such as copper or the like is deposited and patterned to form the gate line 13. Next, a gate insulating film 32 and an amorphous silicon layer 37' are formed on the substrate on which the gate insulating film 13 is formed.

FIG. 6B corresponds to a second mask step in which the amorphous silicon layer 37' is patterned to form an active line, i.e., the semiconductor layer 37. At this time, the semiconductor layer 37 is patterned to be formed at the cross point of the gate line 13 and the date line 15 to be formed in a subsequent step. Here, the semiconductor layer 37 protrudes by a predetermined amount on the gate line 13 in the right direction as shown in FIG. 6B. Alternatively, the semiconductor layer 37 may be formed at a region below the data line 15 as well as the patterned region, which is provided to overcome a drawback where the data line 15 is made of molybdenum (Mo) or the like, thereby reducing adhesive force. Accordingly, if the data line 15 is made of chromium (Cr) or the like that does not exhibit adhesion problems, the semiconductor layer 37 does not need to be patterned with respect to the region below the data line 15. However, FIG. 6B shows that the semiconductor layer 37 is patterned with respect to the region below the data line 15.

Figure 6C:
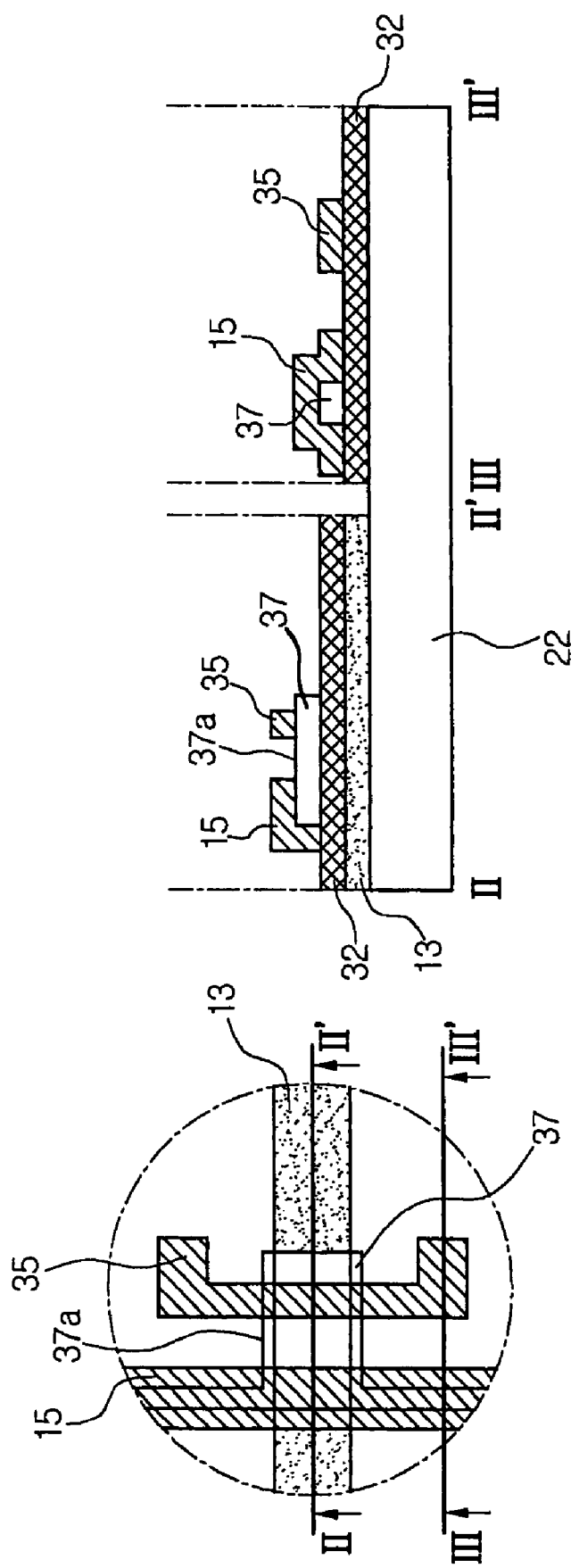

FIG. 6C corresponds to a third mask step in which a conductive metal layer is formed on the semiconductor layer 37 and is patterned to form the data line 15 and the drain electrode 35. The data line 15 is formed crossed with the gate line 13 at a right angle, and the drain electrode is formed to be spaced apart by a certain distance from the data line 15. At the cross point of the gate line 13 and the data line 15 and below the drain electrode 35, the semiconductor layer 37 is formed. In addition, the semiconductor layer 37 is exposed between the data line 15 and the drain electrode to form a channel 37a for a signal to be transferred from the data line to the drain electrode 35. Moreover, in forming the drain electrode 35, both ends of the drain electrode 35 are patterned so as not to be overlapped with the semiconductor layer 37, but to be located outside the semiconductor layer 37.

The steps using the second and third masks shown in FIGS. 6B and 6C may be combined into a single step if a process using four masks is applied. This method is performed by depositing gate insulating film, amorphous silicon layer, impurity-doped amorphous silicon layer, and conductive metal layer, patterning the conductive metal layer to form the data line crossing the gate line and drain electrode spaced apart by a certain interval from the data line and etching the exposed impurity-doped amorphous silicon using the patterned metal layer as an etch stopper to form a channel such that the amorphous silicon layer is exposed between the data line and the drain electrode. According to the aforementioned four masks process, below the data lines 15, 15', the semiconductor layer 37 is formed.

Figure 6D:
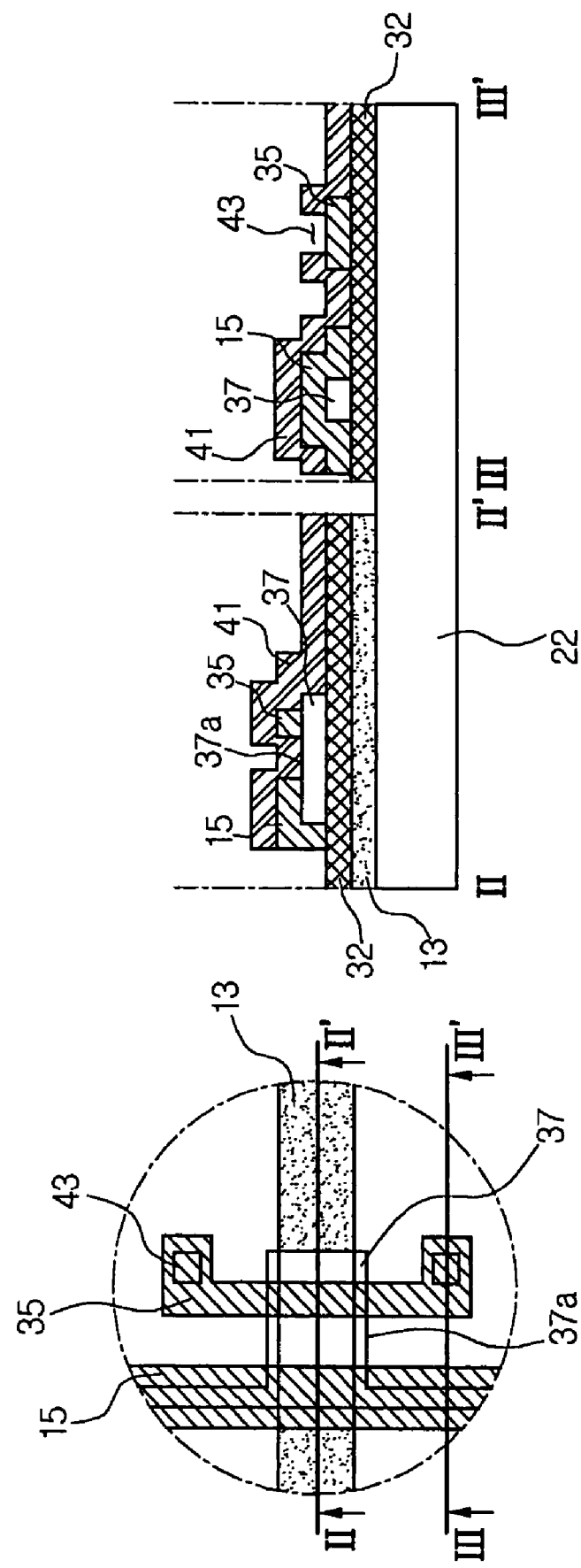

Next, FIG. 6D corresponds to a fourth mask step where a passivation layer 41 of an insulating material is formed on the substrate on which the data line 15 and the drain electrode 35 are formed. The passivation layer 41 is patterned to form drain contact holes 43 at both ends of the drain electrode 35, and the passivation layer 41 on the pixel region (P) except for the upper portions of the gate line 13 and the drain electrode 35 and the upper portions of the gate line 13 and the data line 15 is removed.

Figure 6E:
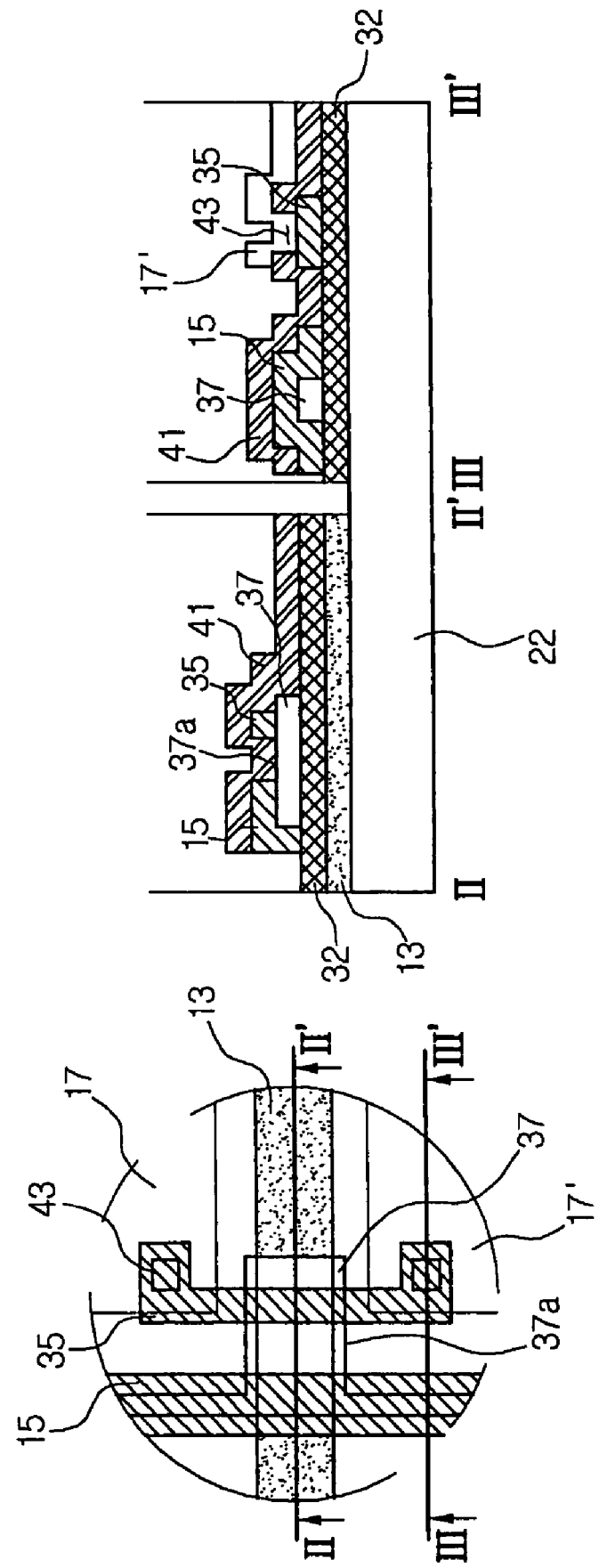

Lastly, FIG. 6E corresponds to a fifth mask step where the pair of pixel electrodes 17, 17' contacting with the drain electrode 35 are formed through the drain contact holes 43 at both ends of the drain electrode 35. At this time, the pair of pixel electrodes 17, 17' are formed respectively spaced apart by predetermined intervals in upward and downward directions from the gate line 13 passing through the pixel region (P) to form a single pixel with respect to the pixel region (P). In other words, the same liquid crystal driving voltage is applied to the pair of pixel electrodes 17, 17'.

Figure 7:
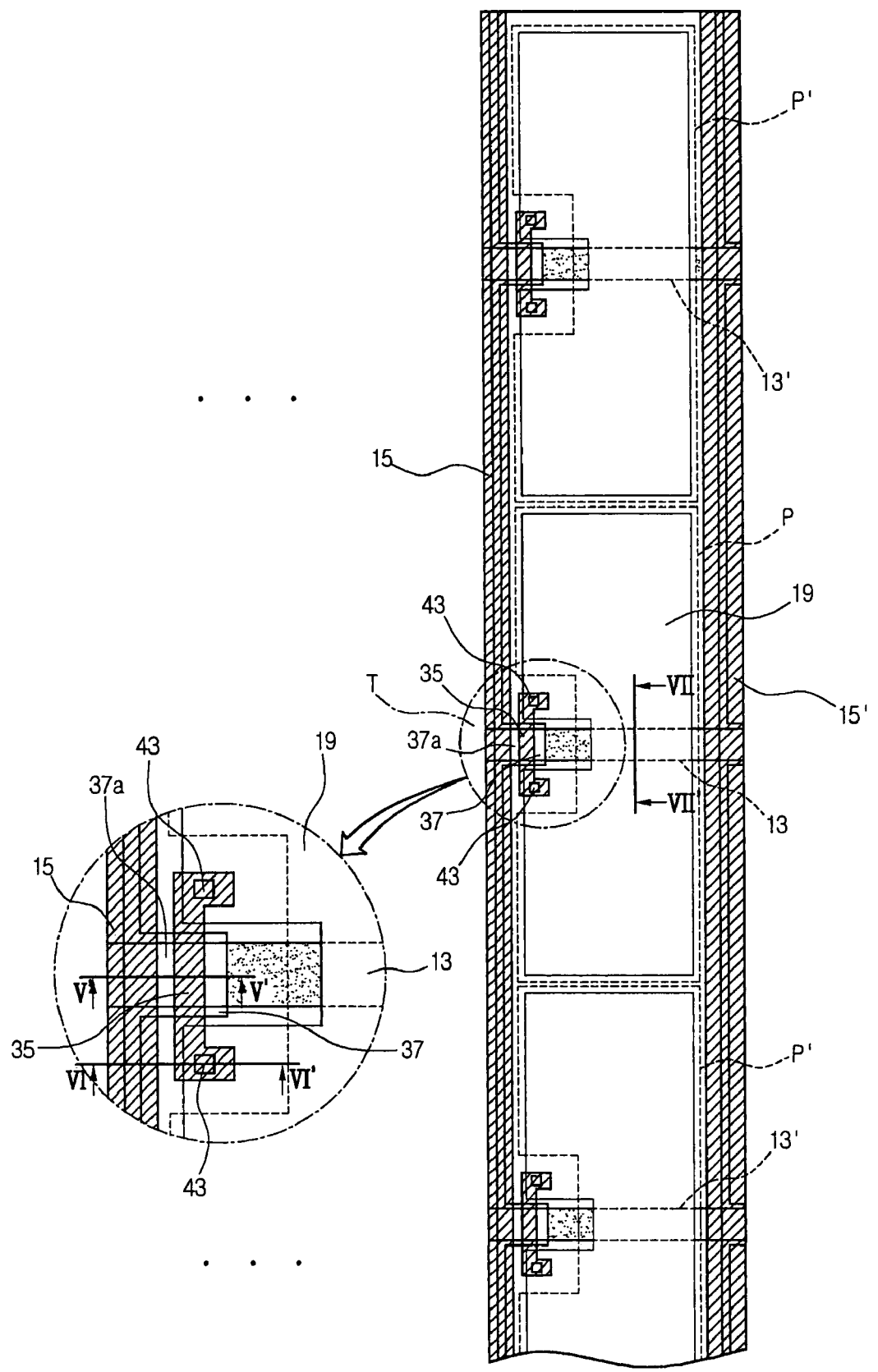
FIG. 7 is a partially magnified plan view of an LCD array substrate according to another exemplary of the present invention.
Figure 8C:
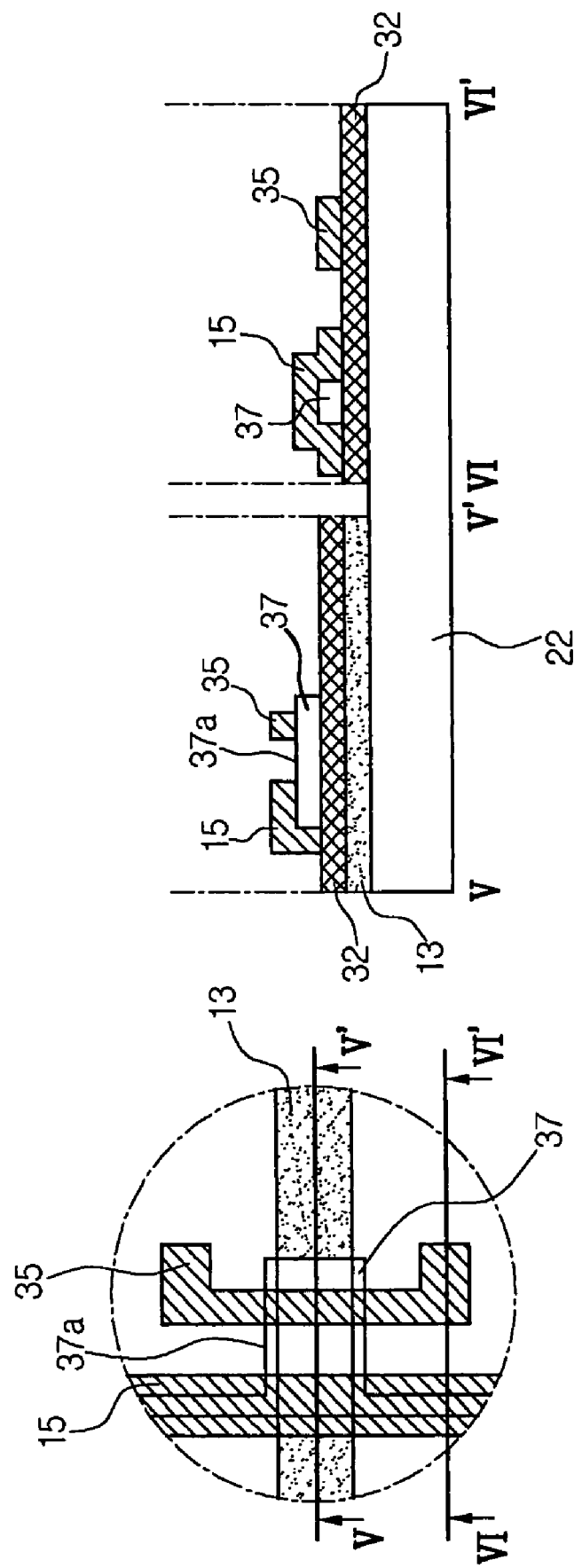
Figure 8D:
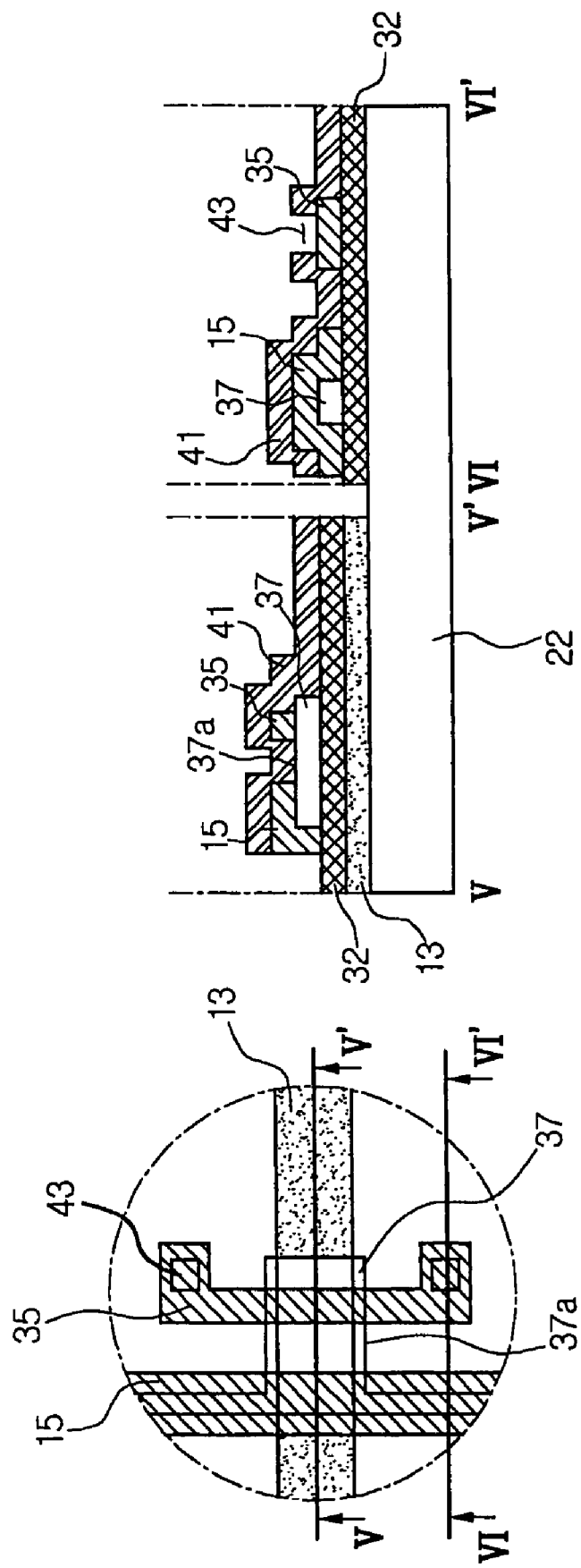
Figure 8E:
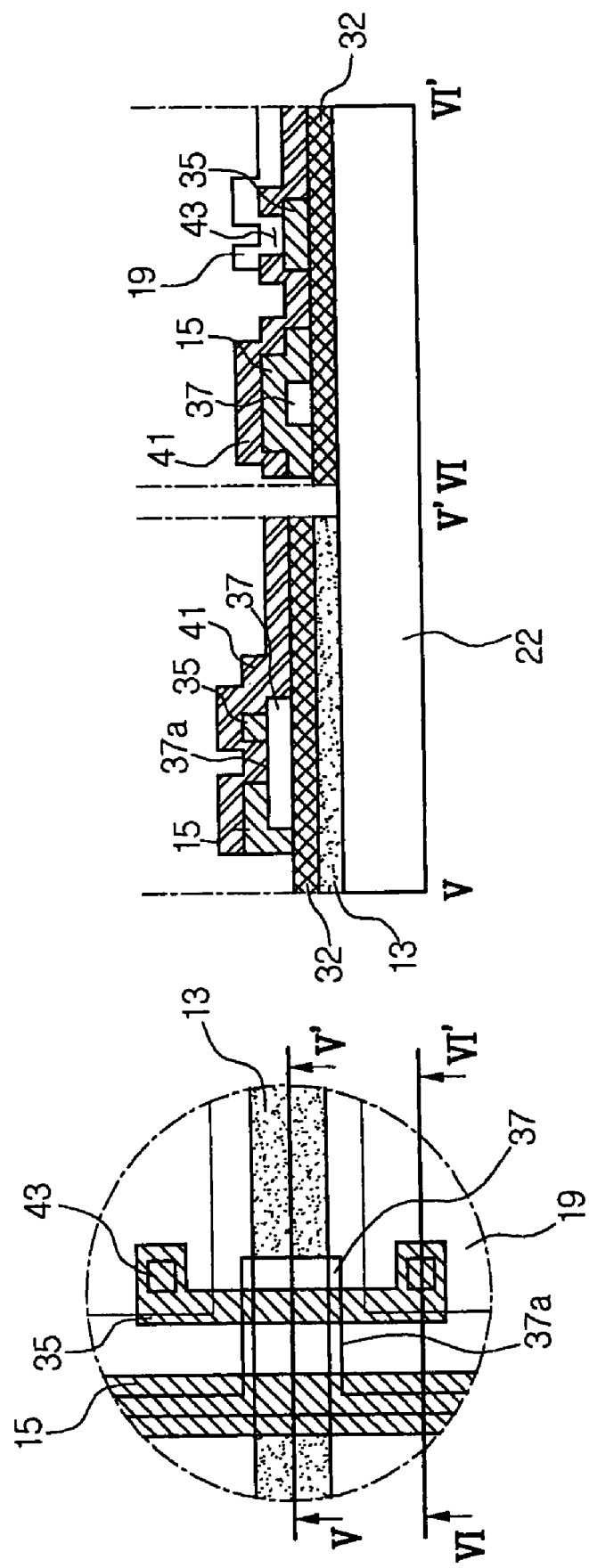

FIG. 7 is a partially magnified plan view of an LCD array substrate according to another exemplary embodiment of the present invention.

Comparing the construction of FIG. 7 with that of FIG. 5, one can recognize the differences therebetween. For example, while the pair of pixel electrodes 17, 17' shown in FIG. 5 are formed separated by certain intervals from the gate line 13 passing through the pixel region (P), a pixel electrode 19 is not separated from the gate line 13 but is overlapped with an upper portion of the gate line 13 passing through the pixel region (P) by a predetermined portion. As a result, a storage capacitor can be formed for every unit pixel.

Referring to FIG. 7, a unit pixel of an LCD array substrate is formed within a pixel region (P) defined by a pair of data lines 15, 15' that are adjacent to each other in a horizontal direction and upper and lower regions of a gate line 13 crossing the pair of data lines 15, 15'. At a cross point of the data line 15 and the gate line 13, a thin film transistor (T) is formed. Here, the upper and lower regions represent regions designed such that the pixel region (P) defined by the gate line 13 is not overlapped with another pixel regions P' defined by the gate lines 13' adjacent to the gate line 13 in upward and downward directions.

The thin film transistor (T) includes the gate line 13 and the data line 15 at the cross point, and a drain electrode 35 spaced apart by a predetermined distance from the data line 15. Between the gate line 13 and the data line 15 at the cross point, the semiconductor layer 37 is formed. The semiconductor layer 37 protrudes by a predetermined amount on the gate line 37. Moreover, the data line 15 and the drain electrode 35 are spaced apart by a predetermined interval on the semiconductor layer 37 formed on the gate line 13. The semiconductor layer 37 has an exposed portion between the data line 15 and the drain electrode 35 that functions as a channel 37a through which a signal is transferred from the data line 15 to the drain electrode. In addition, the drain electrode 35 is formed such that both ends thereof are located outside the semiconductor layer 37 and are respectively electrically connected with both edge portions of the pixel electrode 19.

The pixel electrode 19 is formed overlapping with the gate line 13 by a predetermined portion but not overlapping with the semiconductor layer 37 within the pixel region (P). The gate line 13 and the pixel electrode 19 that overlapped each other by a predetermined amount within the pixel region (P) function as first and second electrodes of a storage capacitor.

Capacitance of storage capacitors formed in the respective unit pixels is controllable considering the sizes of the unit pixel regions arranged in a matrix configuration. In the case of the present invention, by controlling an overlapping area between the gate line 13 and the pixel electrode 19 within the pixel region (P), the capacitance of the storage capacitor can be properly controlled.

FIGS. 8A to 8E are plan and sectional views schematically showing a fabrication process for the LCD array substrate of FIG. 7 with the sectional views are taken along lines V-V' and VI-VI' of FIG. 7. Here, the array substrate is formed by a process using five masks, but the array substrate may be formed by a process using four masks. Also, the semiconductor layer 37 is formed below the data lines 15, 15' as shown. However, the semiconductor layer 37 may not be formed below the data lines 15, 15' which do not form the thin film transistor (T). In addition, FIGS. 8A to 8E are similar to FIGS. 6A to 6E in their process steps except that the pair of pixel electrodes (FIG. 6E) are not formed divided but the pixel electrode 19 (FIG. 8E) is overlapped with the upper portion of the gate line passing through the pixel region by a predetermined portion. Accordingly, a description of FIGS. 8A to 8E is omitted.

Hereinafter, a difference between the exemplary embodiments respectively shown in FIGS. 5 and 7 will be described in detail with reference to FIG. 9. FIGS. 9A and 9B are sectional views taken along the line IV-IV' of FIG. 5 and the line VII-VII' of FIG. 7. From the FIGS. 9A and 9B, differences between the two embodiments should be readily evident.

Figure 9A:
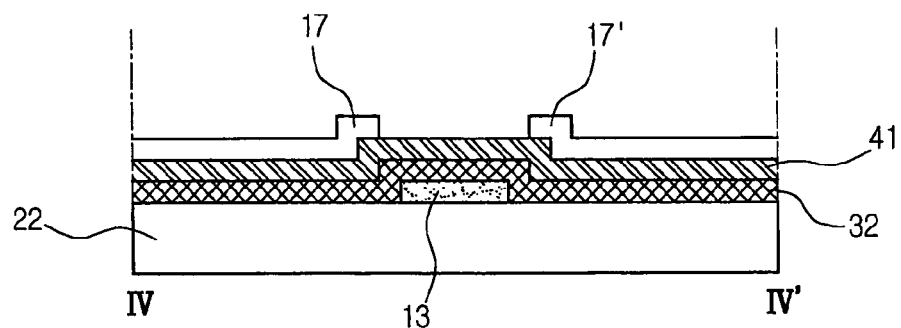
FIGS. 9A and 9B are sectional views taken along the line IV-IV' of FIG. 5 and line VIII-VIII' of FIG. 7.

For example, FIG. 9A shows a section of the gate line 13 passing through the pixel region (P) and the pair of pixel electrodes 17, 17' spaced in upward and downward directions from the gate line 13 in the exemplary embodiment shown in FIG. 5. Since the pair of pixel electrodes 17, 17' connected with both ends of the drain electrode receiving signals from the data line are divided with respect to each of the unit pixels and receive the same signal, they form a signal pixel. To this end, although either of both ends of the drain electrode is opened, point defect can be overcome since the other end is still connected.

Figure 9B:
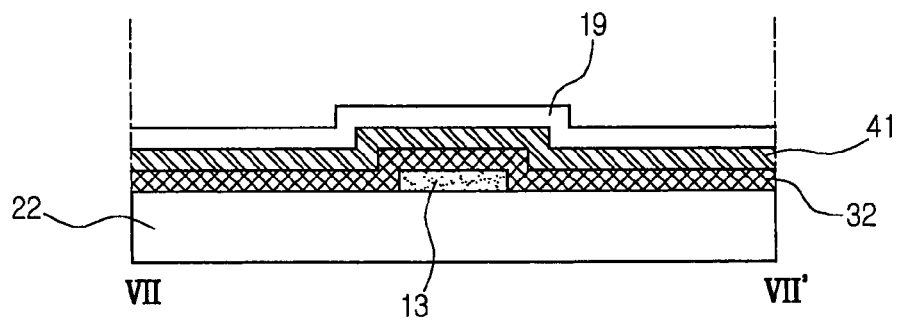

Next, FIG. 9B shows a section of the pixel electrode 19 formed to be overlapped with a portion of the gate line 13 passing through the pixel region (P) but not to be overlapped with the semiconductor layer within the pixel region (P) in an alternate embodiment of FIG. 7. Here, the gate line 13 and the pixel electrode 19 overlap with each other by a predetermined amount within the pixel region (P) to function as first and second electrodes of a storage capacitor. Accordingly, by varying the overlapping area between the gate line 13 and the pixel electrode 19 within the pixel region (P), the capacitance of the storage capacitor can be controlled.

In FIGS. 9A and 9B, reference numerals 32 and 41 indicate a gate insulating film and a passivation film, respectively. The aforementioned embodiments are formed through the processes of FIGS. 6 and 8. Then, according to the array substrate of the present invention fabricated by the above processes, stitch and/or overlay failures caused by the limitation of the preciseness in the photolithography exposure equipment can be overcome. Hereinafter, the stitch and overlay failures will be described.

Generally, the display size of the array substrate is larger than the size of the exposure mask used in the photolithography process. As a result, during the exposure step, the entire region of the array substrate is divided into a plurality of shots and is repeatedly exposed. In this case, since the exposure equipment has a limitation in its preciseness, misalignment between the shots may be generated. The stitch phenomenon indicates such a misalignment. Also, in forming data line and source/drain electrode on the gate line, the mask does not completely accord due to the limitation of the preciseness of the exposure equipment and the like but is distorted. Thus, the gate line and the drain electrode may not be regularly overlapped every pixel region. This is referred to as overlay failure.

If stitch or overlay failure occurs in the related art, there may be a different parasitic capacitance for every pixel region so that picture quality of the LCD is lowered. However, according to the structures of the embodiments of the present invention, although stitch and/or overlay failure occurs (e.g., although shots and/or masks are misaligned), it is possible to overcome such failures because a sufficient margin that does not allow a change in the parasitic capacitance is formed within the thin film transistor region of every pixel region.

In the respective embodiments shown in FIGS. 5 and 7, since the magnified thin film transistor regions accord with each other and the aforementioned stitch and/or overlay failure is problematic in the thin film transistor region, a procedure to overcome the stitch and/or overlay failure through the magnified thin film transistor region in the embodiment of the present invention will now be described with reference to FIGS. 10A to 10E. FIGS. 10A to 10E illustrate a technique to overcome the stitch/overlay failure by the thin film transistor structure in accordance with the present invention.

Here, the stitch failure is a problem occurring when the alignment degree between shots on the same layer is not constant, and the overlay failure is a problem occurring owing to the misalignment of masks between different layers. However, since a result (e.g., a phenomenon where the parasitic capacitance within the thin film transistor region is changed for every pixel region is the same, it will be described without any separation.

Figure 10A:
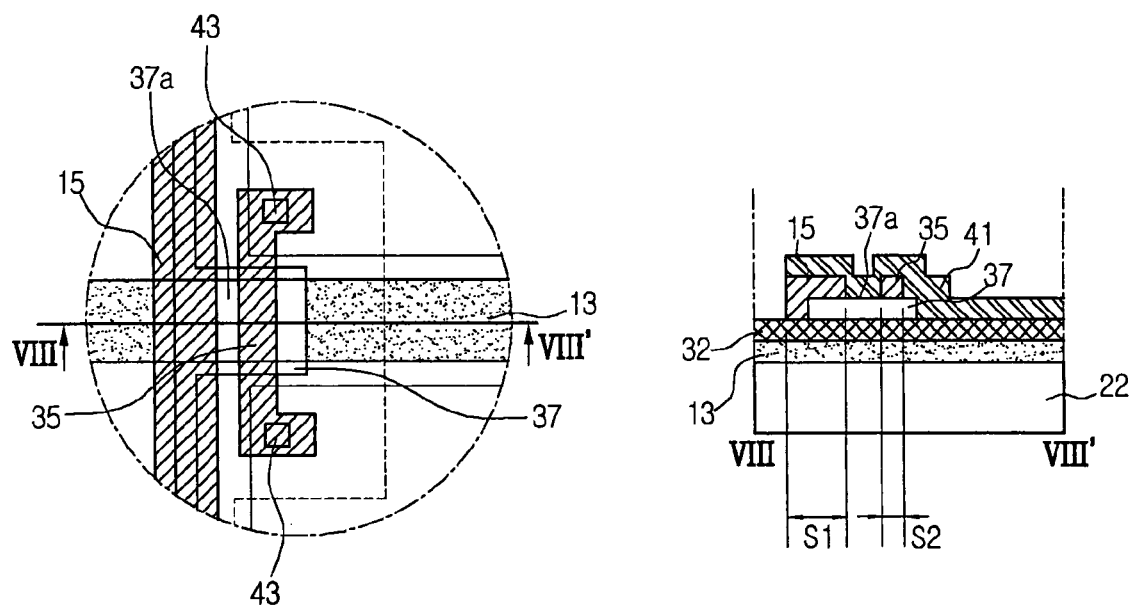

FIG. 10A are plan view and sectional view (taken along line VIII-VIII') of a thin film transistor region.

Referring to FIG. 10A, due to the existence of an overlapping portion (S1) between the gate line 13 and of an overlapping portion (S2) the data line 15 and between the gate line 15 and the drain electrode 35, a parasitic capacitance ($C_{gd}$) is generated. The parasitic capacitance changes the liquid crystal voltage by $\Delta V$ when the thin film transistor is turned on, so that a voltage is generated difference between the initial application voltage and the liquid crystal application voltage. The $\Delta V$ is approximately expressed by equation 2 below:

$$\Delta V = \frac{C_{gd}}{C_{gd} + C_{LC} + C_{ST}} \Delta V_g \quad (2)$$

where $C_{gd}$ is a parasitic capacitance, $C_{LC}$ is liquid crystal capacitance, $C_{ST}$ is a storage capacitance, and $\Delta V_g$ is a voltage different between gate voltages in ON and OFF states, $V_{gh}$ and $V_{gl}$.

Thus, due to the voltage difference ΔV, a phenomenon which the picture undesirably becomes dark and bright (i.e., flicker) occurs. The flicker is overcome by moving the common voltage ($V_{com}$) from the center of the data signal voltage by ΔV such that a direct current (dc) component is deleted while the LCD is operated. In other words, if ΔV generated in the respective pixels is constant, the flicker can be overcome by adjusting the common voltage by a constant amount.

Accordingly, as shown in FIG. 10A, if the parasitic capacitances with respect to the respective thin film transistor regions in a plurality of pixels are constant, this problem can be overcome. However, if the parasitic capacitances with respect to the respective thin film transistor regions in a plurality of pixels are not constant due to the stitch and/or overlay failure, the flicker cannot be overcome by adjusting the common voltage ($V_{com}$) by a constant amount. To overcome this problem, a sufficient margin is formed within the thin film transistor region every pixel region such that the parasitic capacitance is not changed although stitch and/or overlay failure occurs, i.e., shot and/or mask is misaligned.

FIGS. 10B and 10C show that the data line 15 and the drain electrode 35 are patterned to be biased toward the left and right sides due to the stitch/overlay failure. FIGS. 10D and 10E show that the data line 15 and the drain electrode 35 are patterned to be biased toward the upward and downward directions due to the stitch/overlay failure.

Referring to FIGS. 10B to 10E, according to the structures of the present invention, although stitch and/or overlay failure occurs and shot and/or mask is misaligned, there occurs no difference in the overlapping areas (S1, S2) between the gate line 13 and the data line 15 and between the gate line 13 and the drain electrode 35. Thus, no difference between the parasitic capacitances with respect to the pixel regions (P) exists.

According to the thin film transistor structure of the present invention, since a difference in the parasitic capacitance every pixel region does not occur due to the stitch/overlay failure, flicker can be overcome only by adjusting the common voltage ($V_{com}$) by a constant amount. Accordingly, the array substrate produced by the fabrication process of the LCD array substrate can solve the picture imbalance of the LCD due to the stitch and/or overlay failure.

As described previously, in an LCD array substrate and fabrication method thereof according to the present invention, a difference in the parasitic capacitances formed in the thin film transistor region every pixel that may be caused due to the stitch and/or overlay failure is removed. Therefore, a failure in picture quality related with spots of the LCD can be minimized. In addition, in producing large-sized LCDs, the stitch and/or overlay failure can be overcome without additional fabrication process steps.

It will be apparent to those skilled in the art that various modifications and variations can be made in the present invention without departing from the spirit or scope of the LCD array substrate and fabrication method thereof of the present invention. Thus, it is intended that the present invention covers the modifications and variations of this invention provided that they come within the scope of the appended claims and their equivalents.

What is claimed is:

1. An LCD array substrate, comprising:
    a plurality of gate lines arranged in a first direction;
    a plurality of data lines arranged in a second direction to cross the plurality of gate lines, a pixel region being defined by the gate line and the data line and including a first region and a second region divided by the gate line;
    a semiconductor layer formed at overlapping regions of the gate lines and the data lines and extending a predetermined length from the overlapping regions over the gate lines;
    a drain electrode spaced apart from the overlapping regions of the gate and data lines and disposed partially in contact with the semiconductor layer, the drain electrode having ends extended beyond sides of the gate line; and
    a pixel electrode electrically connected with the ends of the drain electrode and overlapping at least a portion of the gate line,
    wherein the pixel electrode is formed in the first and second regions crossing the gate line,
    wherein the pixel region is defined to be overlapped with the gate line passing through the pixel region such that the pixel electrode extends over the gate line.

2. The LCD array substrate according to claim 1, wherein the ends of the drain electrode are extended beyond the semiconductor layer region.

3. The LCD array substrate according to claim 1, wherein the pixel region is defined by a pair of adjacent ones of the data lines and regions adjacent to one of the gate lines crossed with the pair of data lines.

4. The LCD array substrate according to claim 1, wherein the pixel electrode does not extend over the semiconductor layer.

5. The LCD array substrate according to claim 1, wherein the gate line and the pixel electrode function as first and second electrodes of a storage capacitor.

6. The LCD array substrate according to claim 1, wherein a portion of the semiconductor layer between the data line and the drain electrode defines a channel allowing a signal to be transferred from the data line to the drain electrode according to a signal from the gate line.

7. A fabrication method of an LCD array substrate, comprising the steps of:
    forming a plurality of gate lines on a substrate;
    sequentially forming a gate insulating film and a semiconductor layer on the substrate on which the gate lines are formed;
    forming a plurality of data lines and a drain electrode on the semiconductor layer;
    forming a passivation layer on an entire surface of the substrate having the data lines, the drain electrode, the gate lines, and the semiconductor layer;
    forming a contact hole in the passivation layer formed on both ends of the drain electrode; and
    forming a pair of pixel electrodes electrically connected with the drain electrode through the contact hole.

8. The fabrication method according to claim 7, wherein the semiconductor layer is patterned to be formed at an overlapping region of the gate line and the data line and to be further extended from the data line over the gate line.

9. The fabrication method according to claim 7, wherein the pair of pixel electrodes are formed within a pixel region defined by a pair of adjacent data lines and regions adjacent to a one of gate lines crossed with the pair of data lines.

10. The fabrication method according to claim 9, wherein the pair of pixel electrodes are formed spaced apart by predetermined intervals in upward and downward directions from the gate line passing through the pixel region.

11. The fabrication method according to claim 7, wherein the ends of the drain electrode are extended beyond the semiconductor layer.

12. A fabrication method of an LCD array substrate, comprising the steps of:

forming a plurality of gate lines on a substrate;

sequentially forming a gate insulating film and a semiconductor layer on the substrate on which the gate lines are formed;

forming a plurality of data lines and a drain electrode on the semiconductor layer, a pixel region being defined by the gate line and the data line and including a first region and a second region divided by the gate line;

forming a passivation layer on an entire surface of the substrate having the data lines, the drain electrode, the gate lines, and the semiconductor layer;

forming a contact hole in the passivation layer formed on both ends of the drain electrode; and forming a pixel electrode electrically connected with the drain electrode through the contact hole and overlapping a corresponding one of the gate lines, wherein the pixel electrode is formed in the first and second regions crossing the gate line, wherein the pixel region is defined to be overlapped with the gate line passing through the pixel region such that the pixel electrode extends over the gate line.

13. The fabrication method according to claim 12, wherein the semiconductor layer is patterned to be formed at an overlapping region of the gate line and the data line and to be further extended from the data line over the gate line.

14. The fabrication method according to claim 12, wherein the pixel region is defined by a pair of adjacent data lines and regions adjacent to a one of the gate lines crossed with the pair of data lines.

15. The fabrication method according to claim 12, wherein the pixel electrode does not extend over the semiconductor layer.

16. The fabrication method according to claim 12, wherein the ends of the drain electrode are extended beyond the semiconductor layer.

* * * * *